United States Patent [19]

Nakamura et al.

[11] Patent Number: 5,030,542

[45] Date of Patent: Jul. 9, 1991

[54] LIGHT-SENSITIVE MATERIAL CONTAINING SILVER HALIDE, HYDRAZINE DERIVATIVE AND POLYMERIZABLE COMPOUND

[75] Inventors: Koichi Nakamura; Morio Yagihara, both of Kanagawa, Japan

[73] Assignee: Fuji Photo Film Co., Ltd., Kanagawa, Japan

[21] Appl. No.: 385,509

[22] Filed: Jul. 27, 1989

[30] Foreign Application Priority Data

Jul. 27, 1988 [JP] Japan .................................. 63-188674

[51] Int. Cl.$^5$ .......................... G03C 1/72; G03C 1/06
[52] U.S. Cl. .................................... 430/138; 430/264; 430/405; 430/436; 430/598; 430/599
[58] Field of Search ............... 430/138, 264, 292, 405, 430/598, 436, 599, 603

[56] References Cited

U.S. PATENT DOCUMENTS

| | | | |
|---|---|---|---|
| 4,276,364 | 6/1981 | Leone | 430/212 |
| 4,681,836 | 7/1987 | Inoue et al. | 430/434 |
| 4,735,884 | 4/1988 | Tsukahara et al. | 430/138 |
| 4,772,531 | 9/1988 | Tsukahara et al. | 430/138 |
| 4,792,514 | 12/1988 | Nakamura et al. | 430/138 |

FOREIGN PATENT DOCUMENTS 224214 6/1987 European Pat. Off. .
286062 10/1988 European Pat. Off. .

Primary Examiner—Charles L. Bowers, Jr.
Assistant Examiner—Tanis L. Dote
Attorney, Agent, or Firm—Sughrue, Mion, Zinn, Macpeak & Seas

[57] ABSTRACT

A light-sensitive material which comprises a light-sensitive layer and a support is disclosed. The light-sensitive layer contains silver halid grains, at least two hydrazine derivatives and a polymerizable compounds. One hydrazine derivative has the following formula [I]:

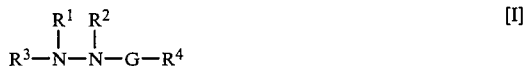

in which one of $R^1$ and $R^2$ is hydrogen, and the other is hydrogen, an alkylsulfonyl group, an arylsulfonyl group or an acyl group; $R^3$ is an aliphatic group, an aromatic group or a heterocyclic group; $R^4$ is hydrogen, an alkyl group, an aralkyl group, an aryl group, an alkoxy group, an aryloxy group, amino or carbamoyl; at least one hydrogen atom contained in $R^3$ or $R^4$ is replaced with a group capable of being adsorbed on silver halide grains; G is carbonyl, sulfonyl, sulfinyl,

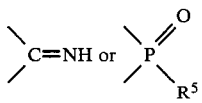

($R^5$ has the same meanings as for $R^4$); and each of $R^1$, $R^2$, $R^3$, $R^4$, $R^5$ and G may have one or more substituent groups. The hydrazine derivative having the formula [I] is adsorbed on the silver halide grains in an amount of $5 \times 10^{-6}$ to $5 \times 10^{-2}$ mole based on 1 mole of the silver halide grains. The other hydrazine derivative functions as a reducing agent.

16 Claims, No Drawings

LIGHT-SENSITIVE MATERIAL CONTAINING SILVER HALIDE, HYDRAZINE DERIVATIVE AND POLYMERIZABLE COMPOUND

FIELD OF THE INVENTION

The present invention relates to a light-sensitive material which comprises a support and a light-sensitive layer containing silver halide, a reducing agent and a polymerizable compound.

BACKGROUND OF THE INVENTION

A light-sensitive material comprising a support and a light-sensitive layer containing silver halide, a reducing agent and a polymerizable compound are used in an image-forming method. The image forming method comprises image-wise exposing to light the light-sensitive material to form a latent image of silver halide, and developing the light-sensitive material to imagewise polymerize the polymerizable compound.

Examples of the image forming method are described in Japanese Patent Publications No. 45(1970)-11149 (corresponding to U.S. Pat. No. 3,697,275), No. 47-(1972) 20741 (corresponding to U.S. Pat. No. 3,687,667) and No. 49(1974) 10697, and Japanese Patent Provisional Publication No. 57(1982) 138632, No. 57(1982) 142638, No. 57-(1982) 176033, No. 57(1982)-211146 (corresponding to U.S. Patent No. 4,557,997), No. 58(1983)-107529 (corresponding to U.S. Patent No. 4,560,637), No. 58(1983) 121031 (corresponding to U.S. Pat. No. 4,547,450) and No. 58(1983) 169143. In the image forming method disclosed in the above.mentioned publications, when the exposed silver halide is developed using a developing solution, the polymerizable compound is induced to polymerize in the presence of a reducing agent to form a polymer image. Thus, this method requires a wet development process using a developing solution. There. fore, the process takes a relatively long time.

An improved image forming method employing a dry pro. cess is described in Japanese Patent Provisional Publica. tions No. 61(1986)-69062 and No. 61(1986)-73145 (the con. tents of both publications are described in U.S. Pat. No. 4,629,676 and European Patent Provisional Publication No. 0174634A2). In this image forming method, a recording material (light-sensitive material) comprising a light.sen. sitive layer containing a light-sensitive silver salt (silver halide), a reducing agent, a polymerizable compound and a binder provided on a support is imagewise exposed to light to form a latent image, and then the material is heated to polymerize within the area where the latent image of the silver halide has been formed.

In the above.mentioned light-sensitive material, the reducing agent has a function of reducing the silver halide and/or a function of accelerating polymerization of the polymerizable compound. Examples of the reducing agents include hydroquinones, catechols, p.aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o or p-sulfonamidonaphthols, 2-sulfonamidoindanones, 4-sulfonamido-5-pyrazolones, 3-sul fonamidoindoles, sulfonamidopyrazolobenzimidazoles, sulfon amidopyrazolotriazoles, p-sulfonamidoketones and hydrazine derivatives. Hydrazine derivatives are particularly pre ferred, since the light-sensitive material using a hydrazine derivative as the reducing agent has a high sen. sitivity and gives a clear image having a high contrast.

Various hydrazine derivatives have been proposed, and described in Japanese Patent Provisional Publications No. 61(1986) 183640, No. 61(1986)-188535, No. 61(1986)-228441 (the contents of these three publications are described in U.S. patent application Ser. No. 827,702), No. 62(1987)-86354 (corresponding to U.S. Pat. No. 4,792,514), No. 62(1987)-86355, No. 62(1987)-264041 (the contents of both publications are described in U.S. Patent Application Ser. No. 917,755 and European Patent Provisional Publication No. 0219087A2), No. 62(1987) 198849 (corresponding to U.S. Patent No. 4,735,884 and European Patent Provisional Publi cation No. 0235751A2) and No. 62(1987) 206540 (corresponding to U.S. Pat. No. 4,772,531).

SUMMARY OF THE INVENTION

An object of the invention is to provide a light sen sitive material which is more improved in the sensitivity.

Another object of the invention is to provide a light-sensitive material which gives a clear image more improved in the contrast.

There is provided by the present invention a light-sensitive material comprising a support and a light-sensitive layer provided thereon which contains silver halide grains, a reducing agent and an ethylenic unsaturated polymerizable compound, wherein the light-sensitive layer contains at least two hydrazine derivatives, one of the hydrazine derivatives being adsorbed on the silver halide grains in an amount of $5 \times 10^{-6}$ to $5 \times 10^{-2}$ mole based on 1 mole of the silver halide grains, and having the following formula [I]:

in which one of $R^1$ and $R^2$ is hydrogen, and the other is a monovalent group selected from the group consisting of hydrogen, an alkylsulfonyl group, an arylsulfonyl group and an acyl group; $R^3$ is a monovalent group selected from the group consisting of an aliphatic group, an aromatic group and a heterocyclic group; $R^4$ is a monovalent group selected from the group consisting of hydrogen, an alkyl group, an aralkyl group, an aryl group, an alkoxy group, an aryloxy group, amino and carbamoyl; at least one hydrogen atom con tained in $R^3$ or $R^4$ is replaced with a group capable of being adsorbed on silver halide grains; G is a divalent group selected from the group consisting of carbonyl, sulfonyl, sulfinyl,

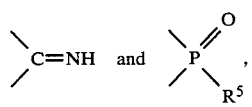

wherein $R^5$ is a mono valent group selected from the group consisting of hydrogen, an alkyl group, an aryl group, an alkoxy group, an aryloxy group, amino and carbamoyl; and each of $R^1$, $R^2$, $R^3$, $R^4$, $R^5$ and G may have one or more substituent groups, and the other hydrazine derivative having the function of a reducing agent.

The present inventors have found that the above-mentioned light-sensitive material is improved in the sensitivity, compared with the known light-sensitive materials. The present inventors have further found that the above-mentioned light-sensitive material gives a clear image improved in the contrast.

These effects of the present invention are due to the combined action of the two hydrazine derivatives.

The hydrazine derivative having the formula [I]is adsorbed on the surface of silver halide grains. This hydrazine derivative increases the sensitivity of the silver halide grains. Therefore, the light-sensitive material of the present invention is improved in the sensitivity.

The other hydrazine derivative functions as a reducing agent to induce a polymerization reaction. According to study of the present inventors, the interaction between two hydrazine derivatives enhances the reducing function of the hydrazine derivative. Therefore, the light-sensitive mate rial of the present invention gives a clear image more improved in the contrast, since a polymerization reaction smoothly proceeds within the exposed area.

DETAILED DESCRIPTION OF THE INVENTION

The hydrazine derivative adsorbed on the silver halide has the following formula [I].

[I]

In the formula [I], one of $R^1$ and $R^2$ is hydrogen, and the other is hydrogen, an alkylsulfonyl group, an arylsulfonyl group or an acyl group. It is most preferred that each of $R^1$ and $R^2$ is hydrogen.

The alkylsulfonyl group and the arylsulfonyl group preferably contains 1-20 carbon atoms. The arylsulfonyl group preferably is phenylsulfonyl. Phenylsulfonyl may have one or more substituent groups. The total substituent constant of the substituent groups for phenylsulfonyl preferably is not less than $-0.5$. The term "substituent constant" means a numerical value deduced from Hammett's rule.

The above-mentioned alkylsulfonyl group and arylsul fonyl group are described in U.S. Pat. No. 4,478,928.

The acyl group preferably contains 1.20 carbon atoms. The acyl group preferably is benzoyl or an aliphatic acyl group. The aliphatic moiety of the aliphatic acyl group may be a straight chain, a branched chain or a cyclic chain. Benzoyl may have one or more substituent groups. The total substituent constant of the substituent groups for benzoyl preferably is not less than $-0.5$.

Each of $R^1$ and $R^2$ may have one or more substituent groups in addition to the above-mentioned groups having the total substituent constant of not less than $-0.5$. Examples of the substituent groups include a halogen atom, an alkoxy group, an aryloxy group, an alkylsulfonylamino group, an arylsulfonylamino group, an acylamino group, carboxyl, hydroxyl and a sulfonic acid group.

In the formula [I], $R^3$ is an aliphatic group, an aromatic group or a heterocyclic group. An aromatic group is most preferred.

The aliphatic group is either an alkyl group, an alkenyl group or an alkynyl group. The aliphatic group may be a straight chain, a branched chain or a cyclic chain.

The aromatic group preferably is a monocyclic or dicyclic aryl group. Examples of the aromatic group include phenyl and naphthyl. Phenyl is particularly pre ferred.

The heterocyclic group contains preferably a 3 to 10-membered ring, and more preferably 5 or 6-membered ring. The ring of the heterocyclic group may be saturated or unsaturated. The hetero.atom preferably is nitrogen, oxygen or sulfur. The ring of the heterocyclic group may form a condensed ring together with an aromatic ring or another heterocyclic ring. Examples of the heterocyclic group include pyridyl, imidazolyl, quinolyl, benzimidazolyl, pyrimidyl, pyrazolyl, isoquinolyl, thiazolyl and benzthia zolyl.

$R^3$ may have one or more substituent groups, such as an alkyl group, an aralkyl group, an alkoxy group, an aryl amino group, amino, an acylamino group, an alkylsulfonyl amino group, an arylsulfonylamino group, an ureido, a carbamoyloxy, an aryloxy, sulfamoyl, carbamoyl, an aryl group, an alkylthio group, an alkylsulfonyl group, an arylsulfonyl group, an alkylsulfinyl group, an arylsulfinyl group, hydroxyl, a halogen atom, a cyano, a sulfonic acid group and a carboxyl group.

In the formula [I], $R^4$ is hydrogen, an alkyl group, an aralkyl group, an aryl group, an alkoxy group, an aryloxy group, an amino or a carbamoyl. Hydrogen is particularly pre ferred.

$R^4$ may have one or mcre substituent groups, such as an alkyl group, an aralkyl group, an alkoxy group, an arylamino group, amino, an acylamino group, an alkylsulfonylamino group, an arylsulfonylamino group, ureido, carbamoyloxy, an aryloxy, sulfamoyl, carbamoyl, an aryl group, an alkylthio group, an alkylsulfonyl group, an arylsulfonyl group, an alkylsulfinyl group, an arylsulfinyl group, hydroxyl, a halogen atom, cyano, sulfonic acid group carboxyl, an acyl group, an acyloxy group, an alkoxycarbonyl group, an aryloxycarbonyl group, an alkenyl group, an alkynyl group and nitro.

In the formula [I], G is carbonyl, sulfonyl, sulfinyl,

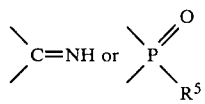

($R^5$ ($R >$ has the same meanings as for $R^4$). Carbonyl is particularly preferred. G may have one or more substituent groups.

When G is carbonyl, $R^4$ preferably is hydrogen, an alkyl group (e.g., methyl), an aralkyl group, an aryl group (e.g., phenyl) or carbamoyl. $R^4$ may have one or more sub. stituent groups, as is mentioned above. Examples of the substituted alkyl group include trifluoromethyl, 3-hydroxypropyl and 3-methylsulfonylaminopropyl. Example of the substituted aralkyl group is o-hydroxybenzyl. Examples of the substituted aryl group include 3,5-dichlorophenyl, o-methylsulfonylaminophenyl and 4-methylsulfonylphenyl. Examples of the substituted carbamoyl group include methylcarbamoyl and phenylcarbamoyl.

When G is sulfonyl, $R^4$ preferably is an alkyl group (e.g., methyl), an aralkyl group or amino. An example of the substituted aralkyl group is o-hydroxybenzyl. An example of the substituted amino group is dimethylamino.

When G is sulfinyl, R⁴ preferably is a substituted aralkyl group (e.g., cyanobenzyl and methylthiobenzyl).

When G is

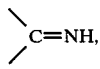

R⁴ preferably is an alkyl group (e.g., methyl and ethyl) or an aryl group (e.g., phenyl).

When G is

R⁴ preferably is an aryl group (e.g., phenyl), an alkoxy group (e.g., methoxy, ethoxy, butoxy) or an aryloxy group (e.g., phenoxy). An aryloxy group is more preferred, and phenoxy is most preferred.

It is most preferred that R⁴ is hydrogen and G is carbonyl.

In the formula [I], at least one hydrogen atom contained in R³ or R⁴ is replaced with a group capable of being adsorbed on silver halide grains.

The group capable of being adsorbed on silver halide grains preferably has the following formula.

in which X is a monovalent organic group containing at least one selected from the group consisting of thioamide bond ( CSNH ), mercapto, disulfide bond and 5 or 6-membered nitrogen.containing heterocyclic ring (5 or 6-membered nitrogen.containing heterocyclic ring is particu. larly preferred); L is a divalent linkage group; and m is 0 or 1.

The thioamide bond (—CSNH—) may be contained in a cyclic moiety or a chain moiety.

The cyclic moiety containing the thioamide bond may be derived from various compounds, such as 4-thiazoline-2-thion, 4-imidazoline-2-thion, 2-thiohydantoin, rhodanine, thiobarbituric acid, tetrazoline-5-thion, 1,2,4-triazoline-3-thion, benzimidazoline-2-thion, benzoxazoline-2-thion and benzthiazoline-2-thion. The chain moiety containing the thioamide bond may be also derived from various compounds, such as thiourea, a thiourethane and a dithiocarbamate. The compounds having the thioamide bond are described in U.S. Pat. Nos. 4,030,925, 4,031,127, 4,080,207, 4,245,037, 4,255,511, 4,266,031 and 4,276,364, Research Disclosure No. 15162 (November, 1976) and Research Disclosure No. 17626 (December, 1978).

The organic group containing the mercapto group may be either an aliphatic group, an aromatic group or a hetero. cyclic group. In the case that nitrogen is a neighboring atom of the carbon atom to which the mercapto group is attached, the organic group containing the mercapto group may be a tautomer of the above-mentioned moiety containing the thioamide bond.

The hetero-atom of the 5- or 6-membered nitrogen.-con. taining heterocyclic ring preferably is nitrogen, oxygen or sulfur. The 5 or 6-membered nitrogen-containing hetero. cyclic ring may be derived from various compounds, such as benztriazole, triazole, tetrazole, indazole, benzimidazole, imidazole, benzthiazole, thiazole, benzoxazole, oxazole, thiadiazole, oxadiazole and triazine. Benztriazole, benz. imidazole, and imidazole are preferred.

The 5. or 6-membered nitrogen-containing heterocyclic ring may have one or more substituent groups, such as an alkyl group, an aralkyl group, an alkoxy group, an aryl. amino group, amino, an acylamino group, an alkylsulfonyl. amino group, an arylsulfonylamino group, ureido, carbamoyl. oxy, an aryloxy, sulfamoyl, carbamoyl, an aryl group, an alkylthio group, an alkylsulfonyl group, an arylsulfonyl group, an alkylsulfinyl group, an arylsulfinyl group, hydroxyl, a halogen atom, cyano, sulfonic acid group, car. boxyl and mercapto. Mercapto is particularly preferred.

The 5. or 6-membered nitrogen-containing heterocyclic ring substituted with mercapto may be also derived from various compounds, such as 2-mercapto-thiadiazole, 3-mercapto-1,2,4-triazole, 5-mercaptotetrazole, 2-mercapto-1,3,4-oxadiazole and 2-mercaptobenzoxazole.

The divalent linkage group (L) is anatomic group containing at leastone of carbon,nitrogen, sulfurand oxygen. Examplesof thelinkage groupinclude an alkylene group,an alkenylene group, an alkynylene group, an arylene group, —O—, —S—, —NH—, —CO—, —SO₂— and the combinations of these divalent groups.

Concrete exaples of the linkage group include —CONH—, —NHCONH—, —SO₂NH—, —COO—, —NHCOO—,

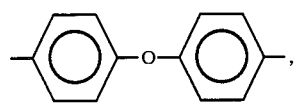

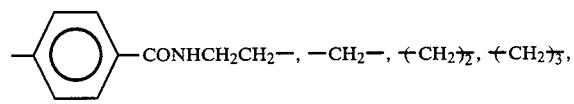

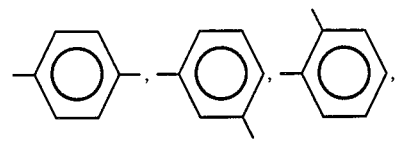

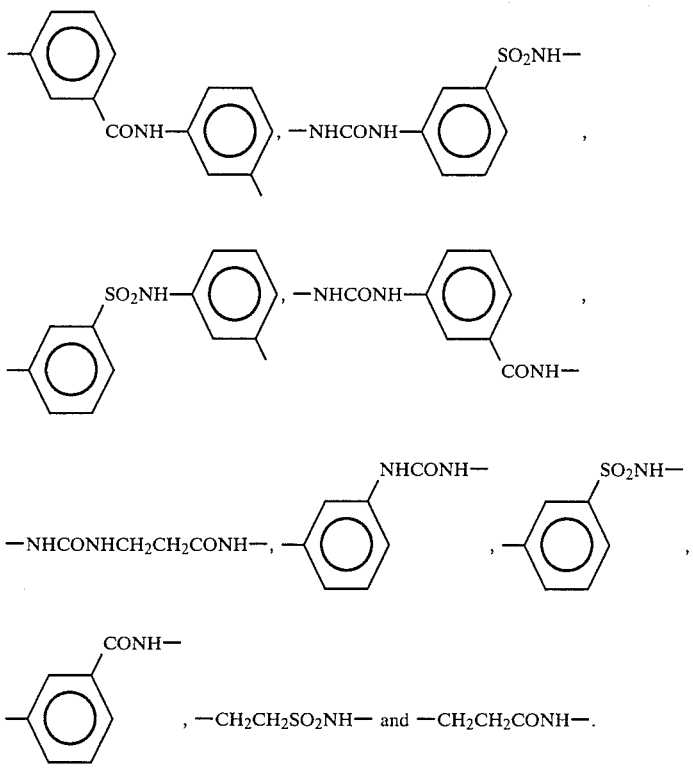

The divalent linkage group (L) may have one or more substituent groups, such as analkyl group, an aralkyl group, an alkoxy group, an arylamino group, amino, an acylamino group, an alkysulfonylamino group, an arylsulfonylamino group, ureido, carbamoyloxy, anaryloxy, sulfamoyl, carbamoyl, an aryl group, analkylthio group, an alkylsulfonyl group, an arylsulfonyl group, analkylsulfinyl group, ann arylsulfinyl group, hydroxyl, a halogen atom, cyano, sulfonic acid group and carboxyl.

The above-mentioned group capable of being adsorbed on silver halide grains is described in U.S. Pat. Nos. 4,030,925, 4,031,127, 4,080,207, 4,245,037, 4,255,511, 4,266,031, 4,276,364, 4,385,108 and 4,459,347, and Japanese Patent Provisional Publications No. 59(1984)-195233, No. 59(1984)-200231, No. 59(1984)-201047, No. 59(1985)-201048, No. 59(1984)-201049, No. 61(1986)-170733, 61(1986)-170744 and 62(1987)-948.

Examples of the hydrazine derivative having the formula [I] are described hereinafter.

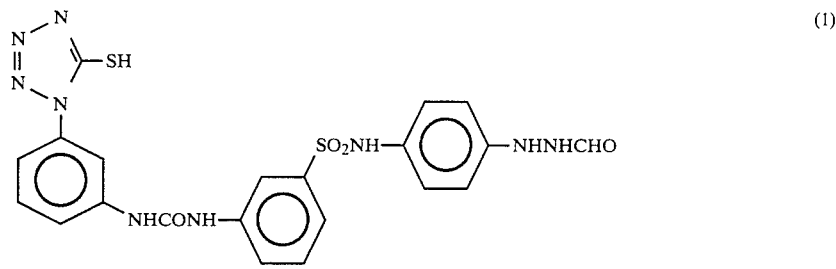

(1)

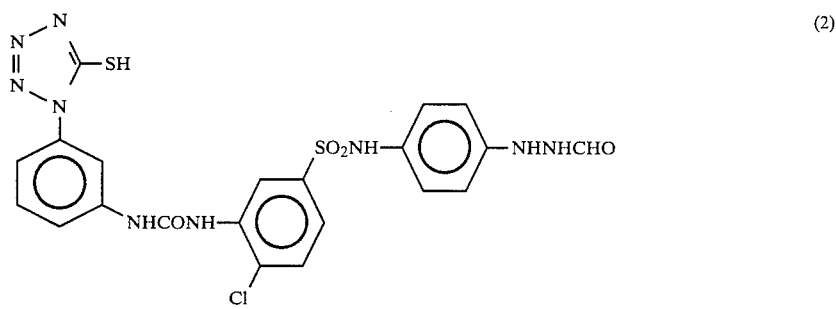

(2)

-continued
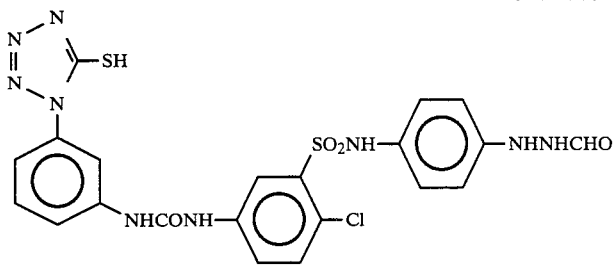
(3)
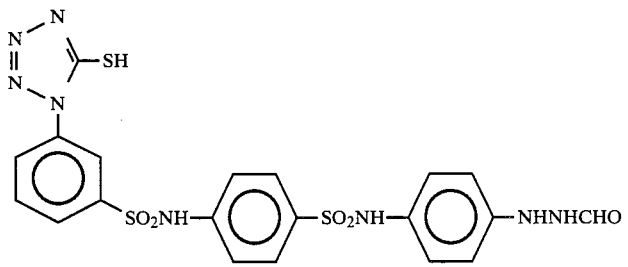
(4)
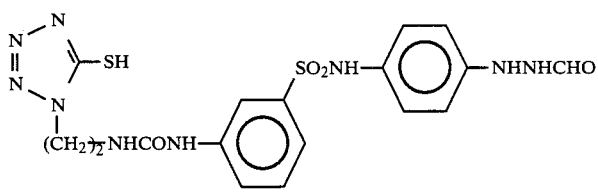
(5)
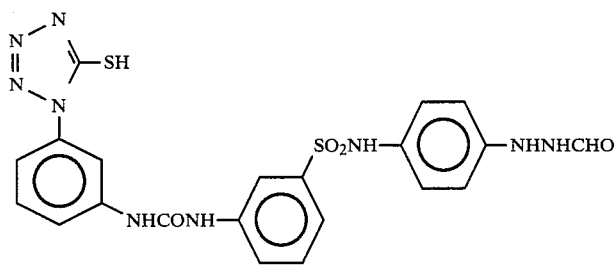
(6)
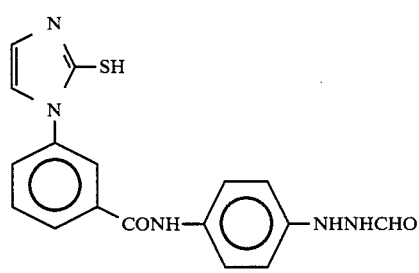
(7)
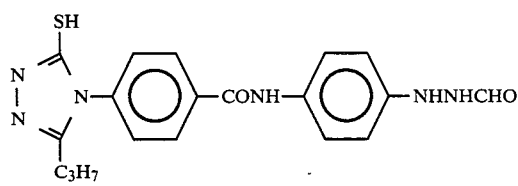
(8)
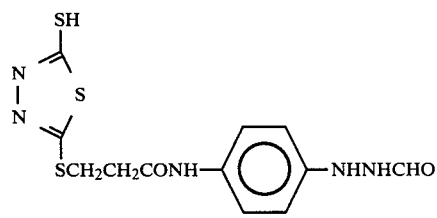
(9)

-continued
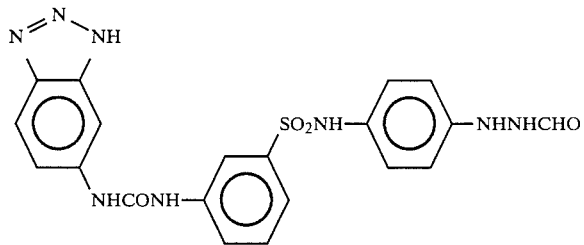
(10)
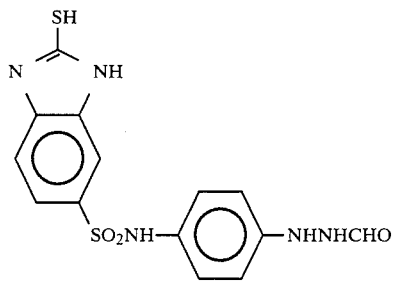
(11)
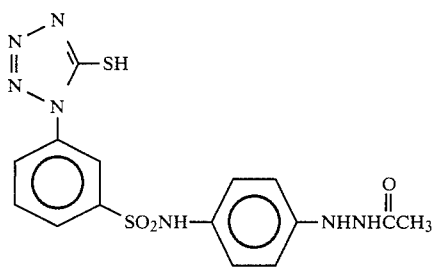
(12)
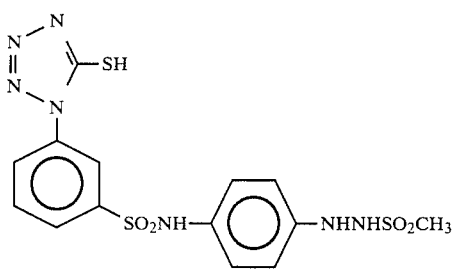
(13)
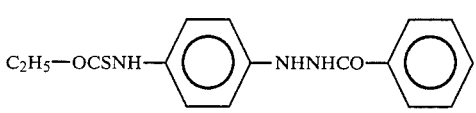
(14)
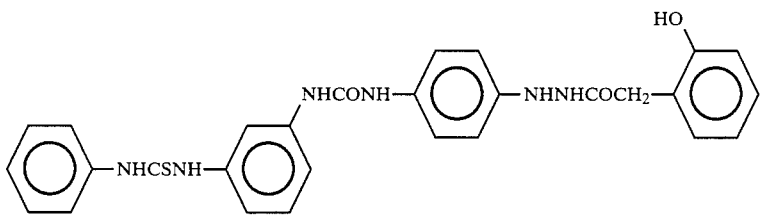
(15)
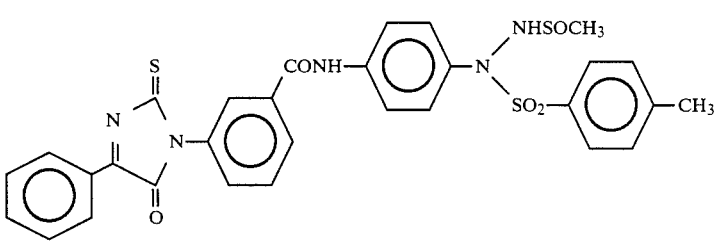
(16)

-continued
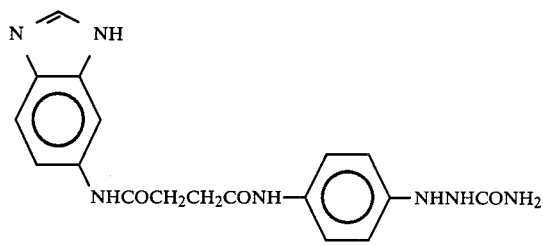 (17)
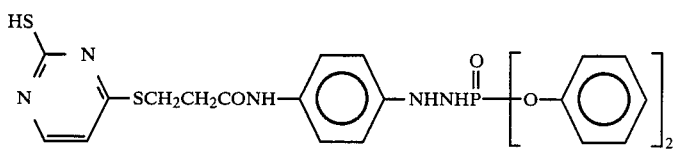 (18)
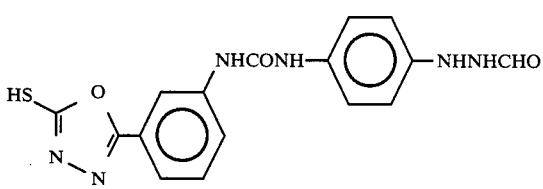 (19)
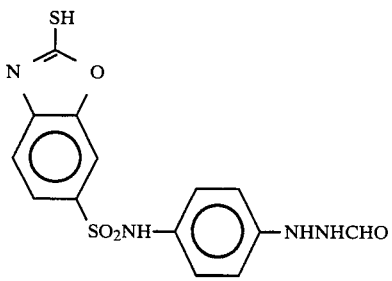 (20)
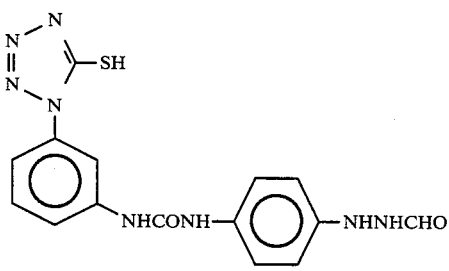 (21)
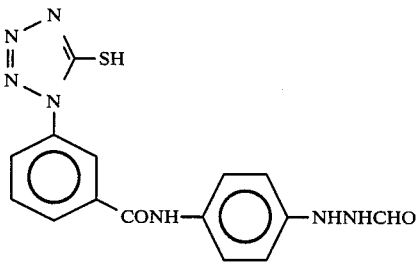 (22)
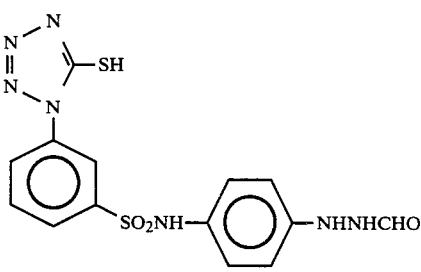 (23)

-continued
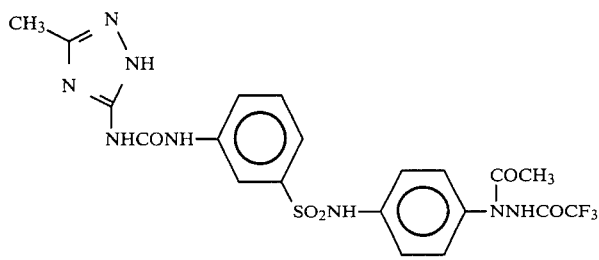
(24)
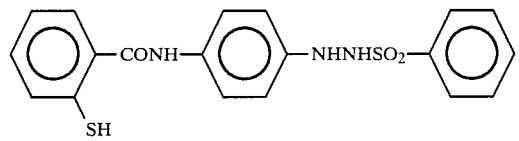
(25)
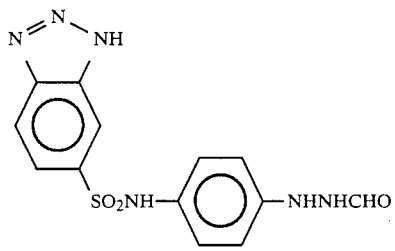
(26)
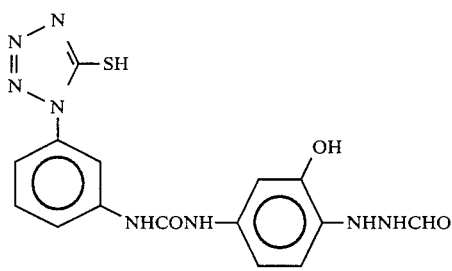
(27)
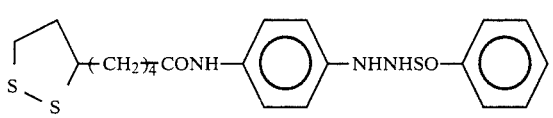
(28)
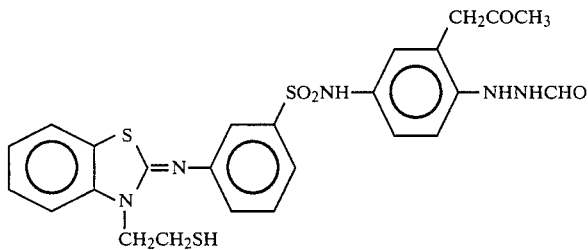
(29)
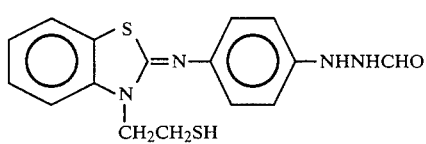
(30)
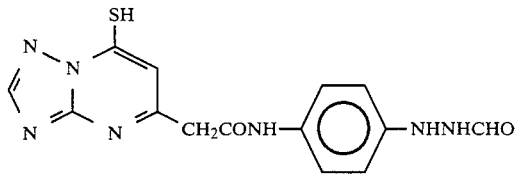
(31)

-continued
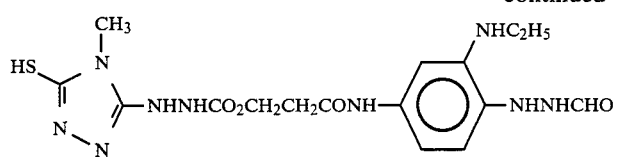
(32)
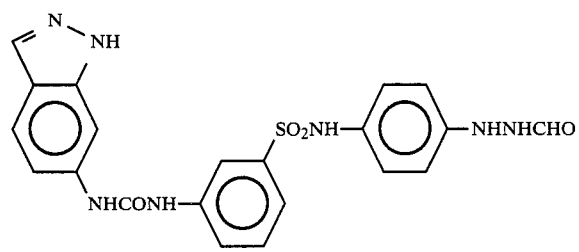
(33)
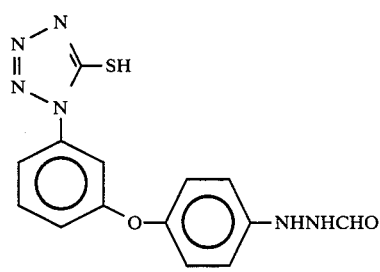
(34)
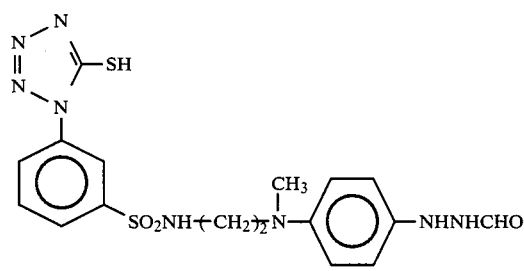
(35)
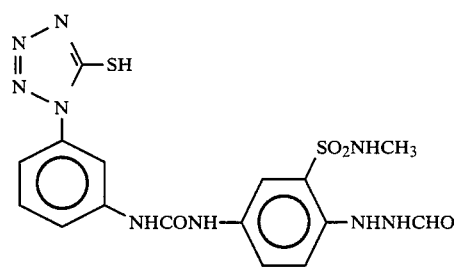
(36)
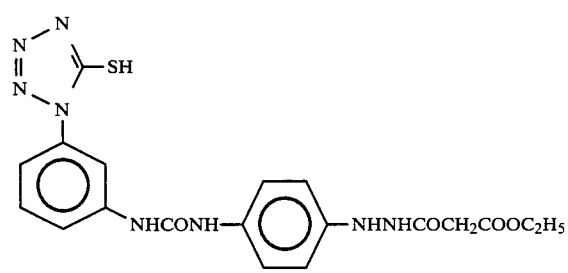
(37)
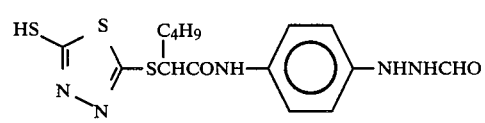
(38)

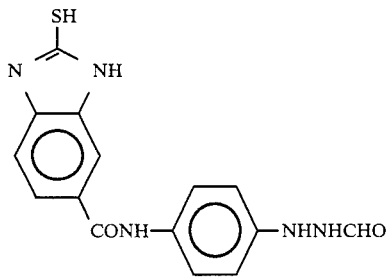

(39)

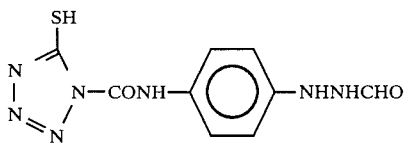

(40)

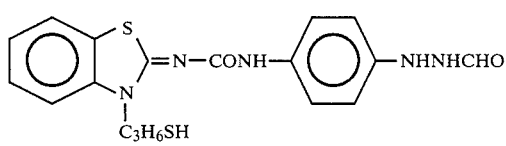

(41)

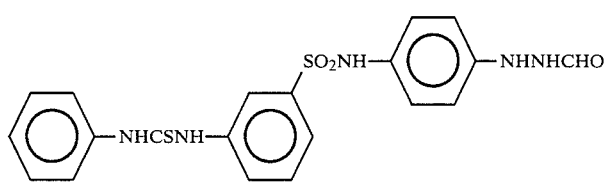

(42)

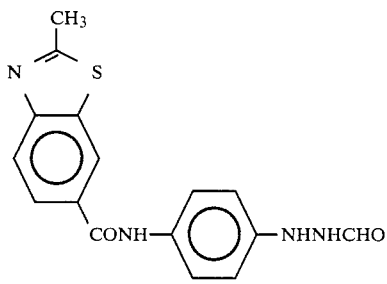

(43)

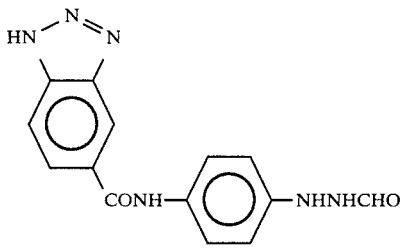

(44)

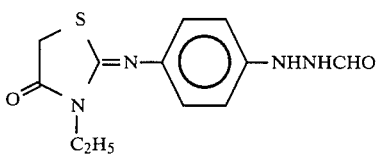

(45)

The hydrazine derivative having the formula [I] can be used singly or in combination. The hydrazine derivative having the formula [I] is adsorbed on the silveer halide grains in an amount of $5 \times 10^{-6}$ to $5 \times 10^{-2}$ mole based on 1 mole of the silver halide grinas. It is more preferred that the hydrazine derivative having the formula[I] is adsorbed on the silver halide grains in an amount of $1 \times 10^{-5}$ to $1 \times 10^{-2}$ mole based on 1 mole of the silver halide grains.

The above-mentioned hydrazine derivative having the formula [I] is adsorbed on the silver halide grains by adding the hydrazine derivative to a silver halide emulsion or a light-sensitive composition (in which a silver halide emulsion is emulsified in a polymerizable compound). It is particularly preferred that the hydrazine derivative having the formula [I] is added to the silver halide emulsion. The details of the process for preparation of the light-sensitive material of the present invention will be described later.

The light-sensitive material of the present invention contains two hydrazine derivatives. One is the above-mentioned hydrazine derivative having the formula [I]. The other functions as a reducing agent. In the present speci fication, the function of the reducing agent means a func tion of reducing the silver halide and/or a function of accelerating polymerization of the polymerizable compound.

Various hydrazine derivatives having such function have been proposed.

Japanese Patent Provisional Publications No. 61(1986)-183640, No. 61(1986)-188535, No. 61(1986)-228441 (the con. tents of these three publications are described in U.S. patent application Ser. No. 827,702) disclose the hydrazine derivative having the following formula [II]:

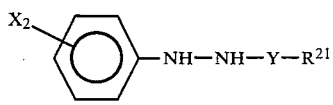

[II]

in which $X^2$ is hydrogen, an alkyl group,

or $R^{24}O—$, positioned in ortho-, meta or para-position on the benzene ring; Y >C=O or —SO₂—; and each of $R^{21}$, $R^{22}$, $R^{23}$ and $R^{24}$ is hydrogen, an alkyl group or a substituted alkyl group, provided that $R^{21}$ is hydrogen when Y is >C=O.

Japanese Patent Provisional Publications No. 62(1987)-86355 and No. 62(1987)-264041 (the contents of both publications are described in U.S. patent application Ser. No. 917,755 and European Patent Provisional Publication No. 0219087A2) disclose the hydrazine derivative having the following formula [III]:

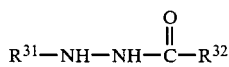

[III]

in which $R^{31}$ is an alkyl group, an aralkyl group, an aryl group, an alkenyl group, an alkynyl group, or a hetero. cyclic group, each of which may have one or more substituent groups; and $R^{32}$ is hydrogen, an alkyl group, a cycloalkyl group, an aralkyl group, an aryl group, an alkenyl group, an alkynyl group, a heterocyclic group, an alkoxy group, an aryloxy group, an alkylthio group, an arylthio group or amino, each of which may have one or more substituent groups.

The above-mentioned formulas [II] and [III] are combined to produce the following formula [VIII]:

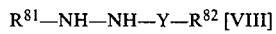 [VIII]

in which $R^{81}$ is a monovalent group selected from the group consisting of an alkyl group, an aralkyl group, an aryl group, an alkenyl group, an alkynyl group, and a heterocyclic group, each of which may have one or more substituent groups; Y is >C=O or —SO₂—; and $R^{82}$ is a monovalent group selected from the group consisting of hydrogen, an alkyl group, a cycloalkyl group, an aralkyl group, an aryl group, an alkenyl group, an alkynyl group, a heterocyclic group, an alkoxy group, an aryloxy group, an alkylthio group, an arylthio group and amino, each of which may have one or more substituent groups.

Japanese Patent Provisional Publication No. 62(1987)-86354 (corresponding to U.S. Pat. No. 4,792,514) discloses the hydrazine derivative having the following for mula [IV]:

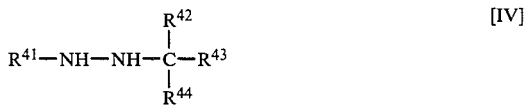

[IV]

in which $R^{41}$ is an aryl group or an aromatic heterocyclic group, each of which may have one or more substituent groups; each of $R^{42}$ and $R^{43}$ is an aryl group which may have one or more substituent groups; and $R^{44}$ is hydrogen, an alkyl group, an aryl group, an alkoxycarbonyl group or carbamoyl, each of which may have one or more substituent groups.

Japanese Patent Provisional Publication No. 62(1987)-198849 (corresponding to U.S. Pat. No. 4,735,884 and European Patent Provisional Publication No. 0235751A2) dis closes the hydrazine derivative having the following for mula [V]:

[V]

in which $R^{51}$ is hydrogen, an alkyl group, a cycloalkyl group, an alkenyl group, an aryl group, an aralkyl group, an alkynyl group or a heterocyclic group, each of which may have one or more substituent groups; each of $R^{52}$ and $R^{53}$ independently is an aryl group which may have one or more substituent group, or $R^{52}$ and $R^{53}$ form, together with the neighboring carbon, a condensed aromatic ring; $R^{54}$ is an aryl group, a heterocyclic group, hydrogen, an alkyl group, an alkoxycarbonyl group or carbamoyl, each of which may have one or more substituent groups.

Japanese Patent Provisional Publication No. 62(1987)-206540 (corresponding to U.S. Pat. No. 4,772,531) discloses the hydrazine derivative having the following formula [VI] or [VII]:

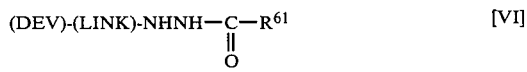 [VI]

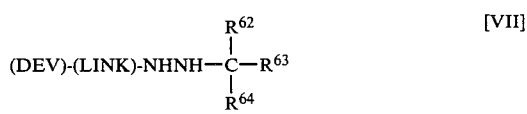 [VII]

in which $R^{61}$ is hydrogen, an alkyl group, a cycloalkyl group, an alkenyl group, an alkynyl group, an aralkyl group, an aryl group or a heterocyclic group, each of which may have one or more substituent groups; each of $R^{62}$ and $R^{63}$ independently is an aryl group which may have one or more substituent groups, or $R^{62}$ or $R^{63}$ form, together with the neighboring carbon, a condensed aromatic ring; $R^{64}$ is an alkyl group, an aryl group, an alkoxycarbonyl group or carbamoyl, each of which may have one or more substituent groups; (DEV) is a monovalent group having a function of reducing silver halide; and (LINK) is a divalent linkage group.

In the present invention, the above-mentioned hydrazine derivatives having the formulas [II]to [VIII] may be used as the reducing agent.

Concrete examples of the hydrazine derivative functioning as the reducing agent include 1-acetyl 2-phenyl hydrazine, 1-acetyl-2-{(p or)o-aminophenyl}hydrazine, 1-formyl-2-{(p. or o)-aminophenyl}hydrazine, 1 acetyl-2-{(p- or o)-methoxy-phenyl}hydrazine, 1 lauroyl-2 [(p or o-) aminophenyl}hydrazine, 1 trityl-2-(2,6 dichloro-4-cyanophenyl)hydrazine, 1-trityl-2-phenylhydrazine, 1-phenyl 2 (2,4,6-trichlorophenyl)hydrazine, 1-[2 (2,5-di-tert-pentylphenoxy)butyloyl}-2-(p. or o-aminophenyl)-hydrazine, 1-{2 (2,5-di.t-pentylphenoxy)-butyloyl}-2 (p. or o-aminophenyl)hydrazine pentadecylfluorocaprylate salt, 3-indazolinone, 1 (3,5-dichlorobenzoyl) 2-phenylhydrazine, 1-trityl-2 [{(2 N.butyl.N.octylsulfamoyl) 4-methanesulfonyl}-phenyl]-hydrazine, 1-{4-(2,5-di.tert-pentylphenoxy) butyloyl}2 (p or o. methoxyphenyl)hydrazine, 1 (methoxy-carbonylbenzohydryl) 2-phenylhydrazine, 1-formyl-2-[4-[2-(2,4-di.tert-pentylphenoxy)butylamide}phenyl hydrazine 1-acetyl-2-[4 {2-(2,4-di.tert-pentylphenoxy)butylamido}-phenyl]hydrazine, 1-trityl-2. {2,6-dichloro-4 (N,N.di-2-ethylhexyl)carbamoyl} phenyl]hydrazine, 1-(methoxycarbonyl benzohydryl)-2 (2,4-dichlorophenyl)hydrazine, 1-trityl-2-{[2-(N.ethyl.-N.octylsulfamoyl)-4-methanesulfonyl}phenyl]-hydrazine, 1-benzoyl-2-tritylhydrazine, 1-(4-butoxy-benzoyl)-2-tritylhydrazine, 1 (2,4 dimethoxybenzoyl) 2-tritylhydrazine, 1-(4-dibutylcarbamoylbenzoyl)-2-tritylhydrazine and 1 (1-naphthoyl)-2-tritylhydrazine.

The hydrazine derivative having the formula [I] is preferably contained in the light-sensitive layer in an amount of $1 \times 10^{-5}$ to $1 \times 10^{31\ 1}$ mole based on 1 mole of the hydrazine derivative having a function of the reducing agent.

The hydrazine derivative having a function of the reducing agent is preferably dissolved or dispersed in the polymerizable compound, and is out of contact with the sil ver halide grains. It is more preferred that the hydrazine derivative having the function of a reducing agent is dis solved in the polymerizable compound.

It is more preferred that the above-mentioned two hydrazine derivatives are used in combination with a devel oping agent, which functions as a reducing agent.

Examples of the developing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reduc. tones, aminoreductones, o or p.sulfonamidophenols, o- or p.sulfonamidonaphthols, 2-sulfonamidoindanones, 4-sulfon. amido-5-pyrazolones, 3-sulfonamidoindoles, sulfonamidopyra. zolobenzimidazoles, sulfonamidopyrazolotriazoles and α-sulfonamidoketones. Concrete examples of the developing agents include pentadecylhydroquinone, 5-t-butylcatechol, p.(N,N.diethylamino)phenol, 1-phenyl-4-methyl-4-hydoroxymethyl-3-pyrazolidone, 1-phenyl-4-methyl-4-heptadecylcarbonyloxymethyl-3 pyrazolidone, 2-phenylsulfonylamino-4 hexadecyloxy-5-t octylphenol, 2-phenylsulfonylamino-4-t-butyl-5-hexadecyloxy-phenol, 2 (N.butylcarbamoyl) 4-phenylsulfonylaminonaphthol and 2-(N-methyl-N-octadecylcarbamoyl)-4-sulfonylaminonaphthol.

The developing agents are described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978).

In the case that the hydrazine derivative is used in combination with the developing agent, certain interactions between the the hydrazine derivative and the developing agent maybe expected. One of the interactions is for acceleration of reduction of silver halide (and/or an organic silver salt) through so.called superadditivity. Other interaction is for a chain reaction in which an oxi dized state of the developing agent formed by a reduction of silver halide (and/or an organic silver salt) induces or inhibits the polymerization of the polymerizable compound via oxidation-reduction reaction with the hydrazine deriva. tive. Both interactions may occur simultaneously, so that it is difficult to determine which of the interactions has occurred in practical use.

The amount of the reducing agent (including the hydrazine derivative having the reducing function and the developing agent) in the light-sensitive layer preferably ranges from 0.1 to 1,500 mole % based on 1 mole of silver (including the above-mentioned silver halide and the optional organic silver salt).

In the case that the silver halide grains, the two hydrazine derivatives and the polymerizable compound are contained in microcapsules, the shell of the microcapsules preferably contains the silver halide grains and the hydrazine derivative having the formula [I], and the core of the microcapsules preferably contains the polymerizable compound and the hydrazine derivative having a function of the reducing agent. In such case, at least 30 weight % (more preferably 50 weight %, and most preferably 70 weight of the hydrazine derivative having the formula [I]is preferably arranged in the shell of the microcapsules, and at least 90 weight % (more preferably 95 weight %, and most preferably 99 weight %) of the hydrazine derivative having a function of the reducing agent is preferably arranged in the core of the microcapsules.

The silver halide grains, the polymerizable compound and the support which constitute the light-sensitive mate. rial of the invention with the two hydrazine derivatives are described below.

Examples of the silver halide grains employable in the light-sensitive material include silver chloride, silver bromide, silver iodide, silver chlorobromide, silver chloroiodide, silver iodobromide and silver chloroiodobro mide in the form of grains.

The halogen composition of individual grains may be homogeneous or heterogeneous. The heterogeneous grains having a multi.layer structure in which the halogen compo sition varies from the outer surface portion (i.e., shell) to the inside portion (i.e., core) are described Japanese Patent Provisional Publication Nos. 57(1982) 154232, 58(1983) 108533, 59(1984) 48755 and 59(1984) 52237, U.S. Pat. No. 4,433,048, and European Patent No. 100,984. A silver halide grain having a core/shell structure in which the silver iodide content in the shell is higher than that in the core can be also employed as described in Japanese Patent Provisional Publication No. 62(1987) 183453.

There is no specific limitation on the crystal habit of silver halide grains. For example, a tubular grain hav. ing an aspect ratio of not less than 3 can be used as described in Japanese Patent Provisional Publication No. 62(1987)-210455.

It is preferred to use silver halide grains having a relatively low fogging value, as described in Japanese Patent Provisional Publication No. 63(1988) 68830.

Two or more kinds of silver halide grains which differ in halogen composition, crystal habit, grain size, and/or other features from each other can be employed in combina tion.

There is no specific limitation on the grain size dis tribution of silver halide grains. For example, silver halide grains having an almost uniform grain size distribu. tion can be employed, as described in Japanese Patent Pro visional Publication No. 62(1987)-210448.

The silver halide grains preferably have a mean grain (or particle) size of 0.001 to 5 μm, more preferably 0.001 to 2 μm.

The amount of the silver halide grains contained in the light-sensitive layer preferably is in the range of 0.1 mg/m$^2$ to 10 g/mz in terms of silver contained the silver halide and an organic silver salt which is one of optional components. The amount of the silver halide contained in the light-sensitive layer preferably is not more than 1 g/m$^2$, more preferably in the range of 1 to 500 mg/m$^2$, in terms of silver only contained in the silver halide.

There is no specific limitation with respect to the polymerizable compound, except that the compound has an ethylenic unsaturated bond. Any known ethylenic unsatu. rated polymerizable compounds can be employed in the inven. tion. In the case that the light-sensitive layer contains a color image forming substance, the polymerizable com. pounds are preferably cross.linkable compounds having plu. ral polymerizable groups in the molecule, because such cross.linkable compounds favorably serve for fixing the color image forming substance in the course of polymeriza. tion hardening of the polymerizable compounds.

Examples of the compounds having an ethylenic unsatu. rated group include acrylic acid, salts of acrylic acid, acrylic esters, acrylamides, methacrylic acid, salts of methacrylic acid, methacrylic esters, methacrylamide, maleic anhydride maleic acid esters, itaconic acid esters, styrene, styrene derivatives, vinyl ethers, vinyl esters, N-vinyl heterocyclic compounds, allyl ethers allyl esters, and derivatives thereof.

Concrete examples of the acrylic esters include n-butyl acrylate, cyclohexyl acrylate, 2-ethylhexyl acry. late, benzyl acrylate, furfuryl acrylate, ethoxyethoxyethyl acrylate, dicyclohexyloxyethyl acrylate, nonylpheny. loxyethyl acrylate, hexanediol diacrylate, butanediol diacrylate, neopentylglycol diacrylate, trimethylolpropane triacrylate, pentaerythritol tetraacrylate, dipenta erythritol pentaacrylate, dipentaerythritol hexacrylate, diacrylate of polyoxyethylenated bisphenol A, diacrylate of 2,2-dimethyl-3-hydroxypropane aldehyde and trimethylol. propane condensate, triacrylate of 2,2-dimethyl-3 hydroxy-propion aldehyde and pentaerythritol condensate, poly. acrylate of hydroxypolyether, polyester acrylate and poly. urethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, penta. erythritol trimethacrylate, pentaerythritol tetrameth. acrylate, and dimethacrylate of polyoxyalkylenated bisphe. nol A.

The polymerizable compounds can be used singly or in combination of two or more compounds. The light-sensitive material containing mixture of two or more polymerizable compounds is described in Japanese Patent Provisional Pub. lication No. 62(1987)-210445. Further, compounds formed by bonding a polymerizable group such as a vinyl group or a vinylidene group to a reducing agent is also employed as the polymerizable compounds. The light-sensitive materials using compounds which show functions as both the reducing agent and the polymerizable compound or both the color image forming substance and the polymerizable compound are included in embodiments of the light-sensitive material employable in the invention.

The amount of the polymerizable compound to be con. tained in the light-sensitive layer preferably ranges from 5 to 120,000 parts by weight, and more preferably from 12 to 12,000 parts by weight, per one part by weight of the silver halide grains.

The light-sensitive material can be prepared by arranging a light-sensitive layer containing the abovemen. tioned components on a support. There is no specific lim. itation with respect to the support. In the case that heat development is utilized in the use of the light-sensitive material, a material for the support preferably is resis. tant to heat given in the developing stage. Examples of the material employable for the preparation of the support include glass, paper, fine paper, coat paper, cast.coat paper, synthetic paper, metals and analogues thereof, films of polyester, acetyl cellulose, cellulose ester, polyvinyl acetal, polystyrene, polycarbonate and polyethylene tereph thalate, and paper laminated with resin or polymer (e.g., polyethylene).

In the case that a porous material such as paper is employed as the support, the porous support preferably has a certain smoothness as described in Japanese Patent Provi sional Publication No. 62(1987) 209529. As the paper sup. port, there can be employed various paper supports such as a paper support having a low water absorption described in Japanese Patent Provisional Publication No. 63(1988)-38934; a paper support having a certain Bekk Smoothness described in Japanese Patent Provisional Publication No. 63(1988)-47754, a paper support having a low shrinkage ratio described in Japanese Patent Provisional Publication No. 63(1988)-81339; a paper support having a low permeation rate described in Japanese Patent Provisional Publication No. 63(1988)-81340, and a paper support having a pH value of 5 to 9 described in Japanese Patent Provisional Publi cation No. 673(1988) 97941.

Various embodiments of the light-sensitive materials, optional components which may be contained in the light-sensitive layer, and auxiliary layers which may be option. ally arranged on the light-sensitive materials are described below.

In the light-sensitive material employable in the invention, the polymerizable compound is preferably dispersed in the light-sensitive layer in the form of oily droplets, as described in Japanese Patent Provisional Pub. lication No. 62(1987)-78552. In the oily droplets may be contained other components for the formation of a light-sensitive sensitive layer such as a silver halide grains, the two hydrazine derivatives and a color image forming substance. The light-sensitive materialin whic the silver halide are contained in theoily droplets is described in Japanese Patent Provisional Publication Nos. 62(1987)-209450 and 62(1987)-164040, and the light-sensitive mateiralin wich the reducing agent is further contained in the oily dropplets is described in Japanese Patent Provisional Publication No. 62(1987)-183453. When the silver halide is to be contined inthe oily droplets, the number ofthesilver halide grainsto be contained in one oily droplet preferably is 5 or more, as described in Japanese Patent Provisional Publicaton No. 63(1988)-15239.

The oily droplet of the polymerizable compound ismore preferably in theform of microcapsule. There is no specific limitation on the process for the formation of the microcapsule, and anyknown process can be applied to the invention. the light-sensitive mateiralin whic the oily droplet of the polymerizable compound is intheformof microcapsule ins described in Japanese Patent Provisioal Publication No. 61(1986)-278441.

There is no specific limitation on the shell materials of the microcapsules. The shell material of the microcapsule employable in the invention preferably has impermeability to the liquid to be contained in the light-sensitive layer in the image-formation stage. The light-sensitive materials using microcapsules having polyamide resin and/or polyester resin shell are described in Japanese Patent Provisional Publication No. 62(1987)-209437. The light-sensitive materials using microcapsules having polyurea resin adn/or polyurethane resin shell are described in Japanese Patent Provisional Publication No. 62(1987)-209438. The light-sensitive materials using microcapsules having amino-aldehyde resin shell are described in Japanese Patent Provisional Publication No. 62(1987)-209439. The light-sensitive materials using microcapsules having gelatin shell are described in Japanese Patent Provisional Publication No. 62(1987)-209440. The light-sensitive mateials using microcapsules having epoxy resin shell are described in Japanese Patent Provisional Publication No. 62(1987)-209441. The light-sensitive materials using microcasules having multi-layer shell of polyamide resin and/or polyurea resin are described in Japanese Patent Provisional Publication No. 62(1987)-209447. The light-sensitive material using microcapsules having multi-layer shell of polyurethane resin and/or plyester resin are described in Japanese Patent Provisional Publication No. 62(1987)-209447.

In the case of using the microcapsules of aldehyde type, the residue of aldehyde is preferably lower than a certain amount as in the light-senstivie mateirals described in Japanese Patent Provisional Publication No. 63(1988)-23535.

In the case that the silver halide is contained in the microcapsule, the silver halide preferably exist in the shell material of the microcasule. The light-sensitive materials using microcapsules containing the silver halide in the shell material are described in Japanese Patent Provisional Publication No. 62(1987)-169147.

In the light-sensitive material of the present invention, the shell of the microcapsules containing the silver halide in the shell of the microcapsules preferably contains the silver halide grains and the hydrazine derivative having the formula [I], and the core of the microcapsules preferably contains the polymerizable compund and hte hydrazine driviative hving a function of the reducing agent as is mentied above.

There can be employed two or more kinds of microcapsules in combination which are differnt from each other in at least one component among the components capable of being contained in microcapsules such as a silver halide, a reducing agent, a polymerizable compound and a color image forming substance (optional component, described here. inafter). Especially in the case of forming a full.color image, three or more kinds of microcapsules having differ. ent color phases are preferably employed in combination. The light-sensitive materials using two or more kinds of microcapsules in combination are described in Japanese Patent Provisional Publication No. 62(1987) 198850.

The mean particle size of the microcapsules preferably is in the range of 3 to 20 $\mu$m. The microcapsule preferably has a homogeneous particle distribution as described in Japanese Patent Provisional Publication No. 63(1988)-5334. The thickness of the shell of the microcapsule preferably is larger than a certain value against the particle diame ter of the microcapsule as described in Japanese Patent Provisional Publication No. 63(1988)-81336.

In the case that the silver halide grains are contained in microcapsules, the mean grain size of the silver halide preferably is not more than one fifth parts of the mean size of the microcapsules, more preferably not more than one tenth parts of the mean size of the microcapsules. When the mean size of the microcapsules is not more than one fifth parts of the mean grain size of silver halide, even and uniform image can be obtained.

The light-sensitive layer may further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pig ments, antiirradiation dyes or pigments, dyes decolored by irradiation with light, matting agents, antismudging agents, plasticizers, water releasers, binders, photo polymerization initiators, solvents of the polymerizable compound, water soluble vinyl polymers and hardening agents.

In the light-sensitive material, a polymer image can be obtained on the light-sensitive layer having the above mentioned constitution. Further, a color image can be obtained on the light-sensitive layer by incorporating a color image forming substance as an optional component into the light-sensitive layer.

There is no specific limitation with respect to the color image forming substance, and various kinds of substances can be employed. Examples of the color image forming substance include colored substance (i.e., dyes and pigments) and non.colored or almost non.colored substance (i.e., color former or dye or pigment-precursor) which develops to give a color under application of external energy (e.g., heating , pressing, light irradiation, etc.) or by contact with other components (i.e., developer). The light-sensitive materials using the color image forming substance are described in Japanese Patent Provisional Publication No. 61(1986)-73145. The light-sensitive material using a dye or pigment as the color image forming substance is described in Japanese Patent Provisional Publication No. (1987)-187346. A light-sensitive material using a dye or pigment as the color image forming substance is described in Japanese Patent Provisional Publication No. 62(1987)-187346. The light-sensitive material using a leuco dye is described in Japanese Patent Provisional publication No. (1987)-209436. The light-sensitive material using a triazen compound is described in Japanese Patent Provisional Publication No. 62(1987)-251741. The light-sensitive material using a leuco dye which gives a yellow color is described in Japanese Patent Provisional Publication Nos. (1987)-288827 and 62(1987)-288828. The light-sensitive material using a leuco dye which gives a cyan color is described in Japanese Patent Provisional Publication Nos. 63(1988)-53542. Examples of dyes and pigments (i.e., colored substance) employable in the invention include commercially available ones as well as various known compounds described in the technical publications, for example, Yuki Gosei Kagaku Kyokai (ed.), Handbook of Dyes (in Japanese, 70) and Nippon Ganryo Gijutsu Kyokai(ed.,), New Handbook of pigments (in Japanese, 1977). Those dyes and pigments can be used in the form of a solution or dispersion.

Examples of the substances which develop to give a color by certain energy include thermochromic compounds piezochromic compounds, photochromic compounds and leuco compounds derived from triarylmethane dyes, quinone dyes, indigoid dyes, azine dyes, etc. Those compounds can develop to give a color by heating, application of pres. sure, light.irradiation or air.oxidation.

Examples of the substances which develop to give a color in contact with other components include various com pounds capable of developing a color through some reaction between two or more components, such as acid.base reaction, oxidation-reduction reaction, coupling reaction, chelating reaction, and the like. Examples of color formation sys. tems are described in Hiroyuki Moriga, "Introduction of Chemistry of Speciality Paper" (in Japanese, 1975), pp. 29–58 (pressure.-sensitive copying paper, [pp. 87–95 (azo.gra. phy), pp. 118–120 (heat-sensitive color formation by a chemical change) or in MSS. of the seminar promoted by the Society of Kinki Chemical Industry, "The Newest Chemistry of Coloring Matter.Attractive Application and New Develop. ment as a Functional Coloring Matter", pp. 26–32 (June 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo coupling reaction between an aromatic a diazonium salt, diazotate or diazosulfonate and naphthol, aniline, active methylene, etc.; a system utiliz ing a chelating reaction, such as a reaction between hexam ethylenetetramine and a ferric ion and gallic acid, or a reaction between a phenolphthalein.complexon and an alka. line earth metal ion; a system utilizing oxidation.reduc tion reaction, such as a reaction between ferric stearate and pyrogallol, or a reaction between silver behenate and 4-methoxy-1-naphthol, etc.

The color image forming substance is preferably used in an amount of 0.5 to 50 parts by weight, more preferably 2 to 30 parts by weight, per 100 parts by weight of the polymerizable compound. In the case that the developer is employed, the amount of the developer is preferably in the range of approx. 0.3 to 80 parts by weight per one part by weight of the color former.

In the case of using two kinds of color image forming substances which give a color when they are brought into contact with each other (e.g., color former and a devel oper), one substance and the polymerizable compound are contained in the microcapsule, and the other is arranged outside of the microcapsule in the light-sensitive layer, with by a color image can be formed on the light-sensitive layer. The light-sensitive material in which a color image can be obtained without using an image.receiving material as described above is described in Japanese Patent Provi sional Publication No. 62(1987)-209444.

There is no specific limitation with respect to the sensitizing dyes, and any known sensitizing dyes used in the conventional art of photography may be employed in the light-sensitive material. Examples of the sensitizing dyes include mathine dyes, cyanine dyes, merocyanine dyes, com. plex cyanine dyes, complex merocyanine dyes, holopolar cya nine dyes, hemicyanine dyes, styryl dyes, and hemioxonol dyes. These sensitizing dyes can be employed singly or in combination, but two or more sensitizing dyes are generally employed in combination for the purpose of supersensitiza tion. In addition to the sensitizing dye, a substance which does not oer se exhibit spectral sensitization effect or does not substantially absorb visible light but shows supersensitizing activity can be employed. The amount of the sensitizing dye to be added generally ranges from approx. $10^{-8}$ to $10^{-2}$ mole per 1 mole of the silver halide.

The sensitizing dye is preferably added during the stage of the preparation of the silver halide emulsion. The sensitizing dye can be added in the stage of the prepa ration of the silver halide grains as described in Japanese Patent Provisional Publication No. 62(1987)-947. The sen sitizing dye can be also added in the stage of the prepara tion of the silver halide emulsion after preparing the sil ver halide grains as described in Japanese Patent Provi sional Publication No. 62(1987)-210449. Concrete examples of the sensitizing dyes are described in Japanese Patent Provisional Publication Nos. 62(1987)-947 and 62(1987)-210449. The sensitizing dye having a sensitivity within the infrared region can be also employed in combination as described in Japanese Patent Provisional Publication No. 62(1987)-210449.

Adding of an organic silver salt to the light.sensi. tive material is particularly effective for the heat devel opment. The reason is assumed that the organic silver salt takes part in a redox reaction using a silver halide latent image as a catalyst when heated to a temperature of 80 ° C or higher. In such case, the organic silver salt is preferably located in contact with the silver halide or closely to the silver halide. Examples of organic compounds employable for forming such organic silver salt include aliphatic or aromatic carboxylic acids, thiocarbonyl group containing compounds having a mercapto group or an hydrogen atom, and imino group.containing compounds. Among them, benztriazoles are most preferred. The organic silver salt is generally used in an amount of from 0.01 to 10 mole, preferably from 0.01 to 1 mole, per 1 mole of the silver halide. Instead of the organic silver salt, an organic compound (i.e., benzotriazole) which can form an organic silver salt in combination with an inorganic silver salt can be added to the light-sensitive layer to obtain the same effect. The light-sensitive material using the organic silver salt is described in Japanese Patent Provi sional Publication No. 62(1987) 3246. The above-mentioned organic silver salt is preferably used in an amount of 0.1 to 10 mole, more preferably 0.01 to 1 mole, per 1 mole of the silver halide.

A radical generator which accelerates (or inhibits) polymerization of the reducing agent may be contained in the light-sensitive layer. A light-sensitive material using a triazene silver as the radical generator is described in Japanese Patent Provisional Publication No. 62(1987)-195639. A light-sensitive material using a silver diazotate as the radical generator is described in Japanese Patent Provisional Publication No. 62(1987) 195640. A light-sensitive material using an azo compound as the radical generator is described in Japanese Patent Provisional Publication No. 62(1987)-195641.

Various image formation accelerators are employable in the light-sensitive material. The image formation acceler. ators have a function to accelerate the oxidation-reduction reaction between a silver halide (and/or an organic silver salt) and a reducing agent, a function to accelerate emi. gration of an image forming substance from a light.sensi. tive layer to an image.-receiving material or an image. receiving layer (described hereinafter), or a similar func. tion. The image formation accelerators can be classified into inorganic bases, organic bases, base precursors, oils, surface active agents, compounds functioning as an antifog ging agent and/or a development accelerator, hot-melt sol. vents, compounds functioning as antioxidants, and the like, from the viewpoint of physicochemical functions. These groups, however, generally have certain combined functions, that is, two or more of the above-mentioned effects, so that the above classification is for the sake of conve. nience, and one compound often has a plurality of functions combined.

Examples of the image formation accelerators are given below.

Preferred examples of the inorganic bases include hydroxides of alkali metals or alkaline earth metals; sec. ondary or tertiary phosphates, borates, carbonates, quino. linates and metaborates of alkali metals or alkaline earth metals; a combination of zinc hydroxide or zinc oxide and a chelating agent; ammonium hydroxide; hydroxides of quater. nary alkylammoniums; and hydroxides of other metals. Pre. ferred examples of the organic bases include aliphatic amines (e.g., trialkylamines, hydroxylamines and aliphatic polyamines); aromatic amines(e.g., N-alkyl.substituted aro. matic amines, N.hydroxylalkyl.substituted aromatic amines and bis[p.(dialkylamino)-phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Examples of the base precursors include guanidine trichloroacetate, piperidine trichloroacetate, morpholine trichloroacetate, p.toluidine trichloroacetate, 2-picoline trichloroacetate, guanidine phenylsulfonyl-acetate, guanidine 4-chlorophenyl. sulfonylacetate, guanidine 4-methyl.sulfonylphenylsulfonyl. acetate, and guanidine 4-acetylaminomethyl propionate.

The bases or the base precursors can be employed in the amount of wide range in the light-sensitive material. The base or base precursor is preferably employed in an amount of not more than 100 % by weight, more preferably from 0.1 to 40 % by weight, based on the total solid con tent of the light-sensitive layer. These bases or base precursors can be used singly or in combination.

The light-sensitive material employing the base or base precursors is described in Japanese Patent Provisional Publication No. 62(1987)-264041. The light-sensitive mate rial employing a tertiary amine as the base or base precur sor is described in Japanese Patent Provisional Publication.No. 62(1987) 170954. The light-sensitive material employ ing dispersed grains of hydrophobic base compound having a melting point of 80° C. to 180° C. is described in Japanese Patent Provisional Publication No. 62(1987)-209523. The light-sensitive material employing guanidine derivatives having a solubility of not more than 0.1 % is described in Japanese Patent Provisional Publication No. 62(1987) 215637. The light-sensitive material employing hydroxydes of alkali metals or alkaline earth metals or salt is described in Japanese Patent Provisional Publication No. 62(1987) 209448.

The light-sensitive material employing acetylide compounds as the base precursor is described in Japanese Patent Provisional Publication No. 63(1988)-24242. The light-sensitive material employing salts of propiolic acid as the base precursor and further containing silver, copper, silver compound or copper compound as the catalyst of the base production reaction is described in Japanese Patent Provisional Publication No. 63(1988)-46446. The light-sensitive material containing the salts of propiolic acid under the condition of being separated from the silver, copper, silver compound or copper compound is described in Japanese Patent Provisional Publication No. 63(1988)-81338. The light-sensitive material containing free ligands in addition to the salts of propiolic acid and the silver, copper, silver compound or copper compound is described in Japanese Patent Provisional Publication No. 63(1988)-97942. The light-sensitive material employing salts of the propiolic acid as the base precursor and further containing heat fusible compounds as the accelerator of the base production reaction is described in Japanese Patent Provisional Publication No. 63(1988)-46447. The light-sensitive material employing salts of sulfonyl acetate as the base precursor and further containing heat fusible compounds as the accerelator of the base production reaction is described in Japanese Patent Provisional Publi. cation No. 63(1988)-48543. The light-sensitive material employing compounds in which isocyanate or isothiocyanate is bonded to organic base is described in Japanese Patent Provisional Publication No. 63(1988)-24242.

In the case of using the base or the base precursor in the light-sensitive material, it is preferred that the sil ver halide, the reducing agent and the polymerizable compound are contained in the aforementioned microcapsules, and the base or base precursor is arranged outside of the microcapsule in the light-sensitive layer. Otherwise, the base or base precursor can be contained in different microcapsules from those containing the polymerizable compound as described in Japanese Patent Provisional Publication No. 62(1987)-209521. The base or base precursor can be con tained in the microcapsules under the condition that the base or base precursor is dissolved or dispersed in an aqueous solution of a water retention agent as described in Japanese Patent Provisional Publication No. 62(1987)-209522, or under condition that the base or base precursor is adsorbed on solid particles as described in Japanese Patent Provisional Publication No. 62(1987) 209526. The base or base precursor contained in the microcapsules preferably has a melting point in the range of 70 to 210° C. as described in Japanese Patent Provisional Publication No. 63(1988)-65437. Further, the base or base precursor can be dissolved ingrains in combination with hydrophobic sub. stance as described in Japanese Patent Provisional Publication No. 63(1988)-97943.

The base or base precursor can be precursor can be contained in a layer different from the light-sensitive layer as described in Japanese Patent Provisional Publica tion No. 62(1987) 253140. The layer containing base or base precursor will be described hereinafter. Further, the base or base precursor may be contained in the aforementioned porous support as described in Japanese Patent Provisional Publication No. 63(1988)-32546.

Examples of the oils employable in the invention include high.boiling organic solvents which are used as solvents for emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator can be used to give an image of high sharpness having a high maximum density and a low minimum density (i.e., an image having high S/N ratio). Examples of the compounds functioning as an antifogging agent and/or a development accelerator include a conventional antifogging agent described in Japanese Patent Pro visional Publication No. 62(1987) 151838; a compound having a cyclic amido structure described in Japanese Patent Pro visional Publication No. 61(1986) 151841; a thioether compound described in Japanese Patent Provisional Publication No. 62(1987)-151842; a polyethylene glycol derivative described in Japanese Patent Provisional Publication No. 62(1987)-151843; a thiol derivative described in Japanese Patent Provisional Publication No,. 62(1987) 151844; an acetylene compound described in Japanese Patent Provisional Publication No. 62(1987)-178232; a sulfonamide derivative described in Japanese Patent Provisional Publication No. 62(1987)-183450; and a salt of quaternary ammonium ion described in Japanese Patent Provisional Publication No. 63(1988)-91653.

The hot-melt solvents preferably are compounds which may be used as a solvent of the reducing agent or those which have high dielectric constant and can accelerate physical development of silver salts. Examples of the hot melt solvents include polyethylene glycols, derivatives of polyethylene oxides (e.g., oleate ester), bees wax, monos tearin and high dielectric constant compounds having —$SO_2$— and/or —CO— group described in U.S. Pat. No. 3,347,675; polar compounds described in U.S. Pat. No. 3,667,959; and 1,10.decanediol, methyl anisate and biphenyl suberate described in Research Disclosure, pp. 26–28 (December 1976). The light-sensitive material employing the hot-melt solvent is described in Japanese Patent Provisional Publication No. 62(1987) 86355.

The compounds functioning as an antioxidant can be employed for the purpose of eliminating the oxygen influ. ence (oxygen has a function as a polymerization inhibitor). An example of the compounds functioning as an antioxidant is a compound having two or more mercapto groups as described in Japanese Patent Provisional Publication No. 62(1987)-209443.

The thermal polymerization initiators employable in the light-sensitive material are compounds which are decomposed under heating to generate a polymerization initiating species, particularly a radical, and those generally employed as an initiator of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobi sisobutyronitrile, 1,1'-azobis-(1-cyclohexanecarbonitrile); dimethyl 2,2'-azobisiso-butyrate, 2,2'-azobis(2-methylbutyronitrile), and azobis-dimethylvaleronitrile; organic peroxides, e.g., benzoyl peroxide, de-tert-butyl peroxide, dicumyl peroxide, tert.butyl hydroperoxide, and cumene hydroperoxide; inorganic peroxides, e.g., hydrogen peroxide, potassium persulfate, and ammcnium persulfate; and sodium p toluenesulfinate. The thermal polymerization initiator is preferably used in an amount of from 0.1 to 120 % by weight, more preferably from 1 to 10 % by weight, based on the amount of the polymerizable compound. In a system in which the polymerizable compound within the area where the latent image has bot been formed is polymerized, the thermal polymerization initiators are preferably incorporated into the light-sensitive layer. The light-sensitive material using the thermal polymerization initiators is described in Japanese Patent Provisional Publication No. 62(1987)-70836.

The development stopping agents employable in the light-sensitive material are compounds that neutralize a base or react with a base to reduce the base concentration in the layer to hereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen.-containing heterocyclic compounds, mercapto compounds, and the like. Examples of the acid precursors include oxide esters described in Japanese Patent Provisional Publication Nos. 60(1985) 108837 and 60(1985) 192939 and compounds which release acids through Lossen rearrangement described in Japanese Patent Provisional Publication No. 60(1985)-230133. Examples of the electrophilic compounds which induce substitution reaction with abses upon heating are described in Japanese Patent Provisional Publication No. 60(1985)-230134.

For the purpose of anti.halation or anti.irradiation, dyes or pigments can be added to the light-sensitive layer of the light-sensitive material. The light-sensitive material comprising the light-sensitive layer which contains white pigment for the purpose of anti.halation or anti-irradiation is described in Japanese Patent Provisional Publication No. 63(1988)-29748.

In the case that the light-sensitive layer of the light-sensitive material employes microcapsules, the dyes having properties of being decolorized when it is heated or irradiated with light can be used. The dyes having such properties can be used in the light-sensitive material as a yellow filter layer in a conventional silver salt photo graphic system. The light-sensitive material employing the dyes having the above properties is described in Japanese Patent Provisional Publication No. 63(1988) 97940.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color for mer described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 μm, more preferably 5 to 40 μm. The size of the par ticle is preferably larger than that of the microcapsule. In the case that the oily droplets of the polymerizable compound is in the form of microcapsules, the size of the particle is preferably larger than that of the microcapsule.

The binder employable in the light-sensitive material can be contained in the light-sensitive layer singly or in combination. The binder preferably is a hydrophilic binder, and representative hydrophilic binders are transparent or semi.transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials, can be also employed. The binder is preferably employed in an amount of 2 to 100 wt. % based on the amount of the polymerizable compound. The light-sensitive material using the binder is described in Japanese Patent Provisional Publication No. 61(1986) 69062. The light-sensitive material using both of the binder and the microcapsules is described in Japanese Patent Provisional Publication No. 62(1987) 209525.

In the light-sensitive material employable in the invention, a hydrophilic binder is preferably used as the binder in combination with a hardener. When the hydrophilic binder is hardened, the light-sensitive layer containing a liquid such as water can be enhanced in the physical properties.

There is no specific limitation on the hardening agent employable in the light-sensitive material. Examples of known hardening agent include aldehydes such as formalde hyde, glyoxal and glutaraldehyde, N.methylol compounds such as dimethylol urea and methylol dimethyl.hydantoin, dioxane derivatives such as 2,3-dihydroxy.dioxane, active vinyl compounds such as 1,3,5-triacryloyl.hexahydro-s-triazine, bis(vinylsulfonylacetamide) and N,N'-trimethylene-bis(vinylsulfonylacetamide), active halogen compounds such as 2,4-dichloro-6-hydroxy-s-triazine, mucohalogen acids such as mucochloric acid and mucopheonxychloric acid, isooxazoles, dialdehyde starch, 1-chloro 6-hydroxytriazinylated gelatin, and epoxy compounds (such as

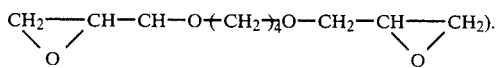

The hardening agent is preferably employed in an amount of 0.1 to 30 wt. %, more preferably 0.5 to 10 wt. %, of the hydrophilic binder.

A photopolymerization initiator can be contained in the light-sensitive later of the light-sensitive material for the purpose of polymerization of the transferred unpolymerized polymerizable compound, as described in Japanese Patent Provisional Publication No. 62(1987)-161149.

In the case of using a solvent for the polymerizable compound, the solvent is preferably contained in a micro-capsule which is different from the microcapsule containing the polymerizable compound. The light-sensitive material employing a polymerizable compound contained in a microcap sule and a blending organic solvent is described in Japanese Patent Provisional Publication No. 62(1987)-209524.

A water soluble vinyl polymer can be adsorbed on the aforementioned silver halide grains. The light-sensitive material employing the water soluble vinyl polymer is described in Japanese Patent Provisional Publication No. 63(1988)-91652.

Examples and usage of other components than the above-mentioned ones which can be optionally contained in the light-sensitive layer are also described in the above-mentioned publications concerning the light-sensitive material, and in Research Disclosure Vol. 170, No. 17029, pp. 9.15 (June 1978).

The light-sensitive layer of the light-sensitive mate rial comprising the above-mentioned components preferably has a pH value of not more than 7 as described in Japanese Patent Provisional Publication No. 62(1987)-275235.

Examples of auxiliary layers which are optionally arranged on the light-sensitive material include an image receiving layer, a heating layer, an antistatic layer, an anti-curling layer, a peel layer, a cover sheet, a protective layer, a layer containing a base or a base precursor, a base barrier layer and an anti.halation layer (colored layer).

Instead of using an image-receiving material (described later), the above-mentioned image-receiving layer can be provided on the light-sensitive material to form an image on the image-receiving layer. The structure of the image-receiving layer provided on the light-sensitive material can be the same as that of the image-receiving material.

The light-sensitive material using a heating layer is described in Japanese Patent Provisional Publication No. 61(1986) 294434. The light-sensitive material provided with a cover sheet or a protective layer is described in Japanese Patent Provisional Publication No. 62(1987)-210447. The light-sensitive material provided a layer containing a base or base precursor is described in Japanese Patent Provisional Publication No. 62(1987)-253140. The light-sensitive material provided with a colored layer as the anti.halation layer is described in Japanese Patent Provisional Publication No. 63(1988)-101842. The light-sensitive material provided with a base barrier layer is described in Japanese Patent Provisional Publication No. 62(1987)-253140. Examples of other auxiliary layers and usage thereof are described in the above-mentioned publications concerning the light-sensitive materials.

The process for the preparation of a light-sensitive material is described below.

Various processes can be employed for preparing a light-sensitive material. In a generally known process, a light-sensitive material can be prepared by dissolving, emulsifying or dispersing each of the components of the light-sensitive layer in an adequate solvent to obtain a coating solution, then applying the solution onto the aforementioned support, and drying the coated layer of the solution.

The coating solution can be generally prepared by preparing liquid compositions each composition containing each component and mixing those compositions with each other. Each of the liquid compositions may contain plural components. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Processes for the preparation of the liquid composition and the coating solution are described below.

The silver halide emulsion can be prepared by any known processes such as an acid process, a neutral process or an ammonia process.

In the stage for the preparation, a soluble silver salt and a soluble halogen salt can be reacted in accordance with a single jet process, a double jet process or a combination thereof. A reverse mixing method in which grains are formed in the presence of excess silver ions, or a controlled double jet process in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980) 158124 and 55(1980)-158124 and U.S. Pat. No. 3,650,757.

The silver halide emulsion may be of a surface latent image type that forms a latent image predominantly on the surface of silver halide grains, or of an inner latent image type that forms a latent image predominantly in the inside of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Provisional Publication No. 58(1983)-3534 and Japanese Patent Publication No. 58(1983)-136641, etc. The nucleating agent is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsion, various hydrophilic colloids are advantageously used as protective colloids. Examples of employable hydrophilic colloids include proteins (e.g., gelatin, gelatin derivatives, gelatin grafted with other polymers, albumin and casein), cellulose derivatives (e.g., hydroxyethyl cellulose and cellulose sulfate), saccharide derivatives (e.g., sodium alginate and starch derivative), and a wide variety of synthetic hydrophilic polymers, such as polyvinyl alcohol, polyvinyl alcohol partial acetal, poly-N-vinylpyrrolidone polyacrylic acid, polymethacrylic acid, polyacrylamide, polyvinylimidazole, and polyvinylpyrazole and copolymers comprising monomers constituting these homopolymers. Among them, gelatin is most preferred. Examples of the employ. able gelatin include not only lime.treated gelatin but also acid.treated gelatin and enzyme.treated gelatin. Hydrolysis products or enzymatic decomposition products of gelatin can be also employed.

In the formation of silver halide grains in the silver halide emulsion, ammonia, an organic thioether derivative (see: Japanese Patent Publication No. 47(1972)-386) or sulfur-containing compound (see: Japanese Patent Provisional Publication No. 53(1987) -b 144319) can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. For the chemical sensitization of the emulsion employable for the light-sensitive material, there can be employed sulfur sensitization, reduction sensitization or noble metal sensitization, etc, singly or in combination. Those chemical sensitization processes can be carried out in the presence of a nitrogen.containing heterocyclic compound as described in Japanese Patent Provisional Publications Nos-58(1983)-126526 and 58(1983)-215644.

When a sensitizing dye is added to the silver halide emulsion, the sensitizing dye is preferably added during the stage of preparation of the emulsion as described in the above-mentioned Japanese Patent Provisional Publication Nos. 62(1987)-947 and 62(1987)-210449. When the nitrogen-containing heterocyclic compound functioning as an antifogging agent and/or a development accerelator is added to the silver halide emulsion, the compound is preferably added during the stage of the formation or ripening of the silver halide grains. The process for the preparation of the light-sensitive material employing the nitrogen.containing heterocyclic compound os described in Japanese Patent Provisional Publication No. 62(1987)-161144.

In the preparation of the light-sensitive material of the present invention, the hydrazine derivative having the formula [I] is preferably added to the above-mentioned silver halide emulsion.

When the organic silver salt is contained in the light-sensitive layer, the emulsion of the organic silver salt can be prepared in the similar manner to that in the preparation of the silver halide emulsion.

In the preparation of the light-sensitive material, the polymerizable compound can be used as a medium for the preparation of a liquid composition containing other components of the light-sensitive layer. For example, the silver halide (including silver halide emulsion), reducing agent (including the hydrazine derivative functioning as the reducing agent), color image forming substance, and the like can be dissolved or emulsified in the polymerizable compound. Especially when the color image forming substance is used, the substance is preferably introduced into the polymerizable compound. Further, when the oily droplets of the polymerizable compound are made in the form of microcapsules, components of the shell material may be contained in the polymerizable compound.

A light-sensitive composition containing the polymerizable compound which contains the silver halide can be prepared using the silver halide emulsion. Otherwise, a silver halide powder prepared by lyophilization can be also employed other than the silver halide emulsion to prepare the light-sensitive composition. The light-sensitive composition can be obtained by stirring the polymerizable compound and the silver halide using a homogenizer, a blender, a mixer or other conventional stirring device.

A copolymer consisting of hydrophilic repeating unit and hydrophobic repeating unit is preferably dissolved in the polymerizable compound employed in the preparation of the light-sensitive composition, as described in Japanese Patent Provisional Publication No. 62(1987)-209449.

The light-sensitive composition can be also prepared by dispersing microcapsules containing silver halide emulsion as a core material in the polymerizable compound instead of employing the above copolymer, as described in Japanese Patent Provisional Publication No. 62(1987)-164041.

The polymerizable compound or the above-mentioned light-sensitive composition which further contains other components is preferably employed in the form of an emulsion in which the compound or the composition is emulsified in an aqueous medium. In the case of preparing microcap sules of oily droplets containing the polymerizable compound, it is possible that the shell material required for the preparation of microcapsules is added to the emulsion and the emulsion is then subjected to a process for forming a shell of microcapsule, as described in Japanese Patent Provisional Publication No. 61(1986)-275742. Otherwise, to the emulsion may be also added a reducing agent or other optional components.

Examples of the processes for preparing microcapsules (encapsulation processes) include a process utilizing con servation of a hydrophilic shell material as described in U.S. Pat. Nos. 2,800,457 and 2,800,458; an interface polymerization process as described in U.S. Pat. No. 3,287,154, British Patent No. 990,443, and Japanese Patent Publication Nos. 38(1963)-19574, 42(1967)-446 and 42(1967) 771; a polymer deposition process as described in U.S. Pat. Nos. 3,418,250 and 3,660,304; a process using an isocyanate.polyol shell material as described in U.S. Pat. No. 3,796,669; a process using an isocyanate shell material as described in U.S. Pat. No. 3,914,511; a process using an urea.formaldehyde or urea-formaldehyde-resorcinol shell material as described in U.S. Pat. Nos. 4,001,140, 4,087,376 and 4,089,802; a process using a shell material such as melamine.formaldehyde resin or hydroxypropyl cellulose as described in U.S. Pat. No. 4,025,455; an in.situ process utilizing polymerization of monomers as described in Japanese Patent Publication No. 36(1961)-9168 and Japanese Patent Provisional Publication No. 51(1976)-9079; a polymerization.dispersion cooling process as described in U.K. Patent Nos. 927,807 and 965,074; and a spray.drying process as described in U.S. Pat. No. 3,111,407 and U.K. Patent No. 930,422. The process for encapsulation of oily droplets of the polymerizable compound is by no means restricted to the above-mentioned processes, but most preferred is a process comprising emulsifying a core material and then forming a polymer film as a shell of the microcapsule around the core material.

The light-sensitive microcapsules employable for the preparation of the light-sensitive material are described in Japanese Patent Provisional Publication Nos. 62(1987)-169147, 62(1987)-169148, 62(1987)-209437, 62(1987)-209438, 62(1987) 209439, 62(1987) 209440, 62(1987)-209441, 62(1987) 209447, and 62(1987)-209442.

When the polymerizable compound is a light-sensitive composition containing the silver halide, the obtained emulsion of the polymerizable compound (including a micro. capsule dispersion obtained by the above-mentioned process) can be employed oer se as a coating solution for preparing a light-sensitive material. When the light-sensitive com. position does not contain the silver halide, the obtained emulsion can be mixed with other emulsions such as silver halide emulsion and an emulsion containing other optional component (e.g., organic silver salt) to prepare a coating solution. Other optional components can be also added to the coating solution.

The coating solution prepared as above is coated over a support, and the coated layer of the solution is dried to prepare a light-sensitive material. Coating of the solution over the support can be readily performed by known processes.

Use of the light-sensitive material of the present invention is described below.

The image forming method (namely use of the light-sensitive material) comprises imagewise exposing to light the light-sensitive material and developing the light-sensitive material to form a polymer image.

Various exposure means can be employed in the imagewise exposure, and in general, a latent image of the silver halide is obtained by imagewise exposure to radiation including visible light. The kind of light source or the amount of light employed in the exposure can be selected depending on the light-sensitive wavelength determined by spectral sensitization or sensitivity of silver halide. An original image can be either monochromatic image or color image.

Development of the light-sensitive material can be conducted simultaneously with or after the imagewise expo sure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time. Therefore, the latter method is preferred as the development process of the light-sensitive material.

Heating in the heat development process can be conducted in various known manners. The heating layer which is arranged on the light-sensitive material can be used as the heating means. Heating temperature for the development process usually ranges from 80° C. to 200° C, and preferably from 100° C to 160° C. Various heating patterns are applicable. The heating time is usually from 1 second to 5 min. utes, and preferably from 5 seconds to 1 minutes.

In the above-mentioned development process, a polymer image can be formed on the light-sensitive layer. A color image can be also obtained by fixing a dye or pigment on the polymer image.

As described in Japanese Patent Provisional Publication No. 62(1987) 209444, a color image can be also formed on the light-sensitive material using two kinds of substances which form a color when brought into contact with each other. In this method, one of the substances is contained in microcapsules dispersed in the light-sensitive layer and the other is arranged outside of the microcapsules, and the light-sensitive material having been subjected to the development process is pressed to rupture the microcapsules so as to being into contact the two kinds of substances with each other.

An image-receiving material can be employed to form a polymer image.

After the development process, the light-sensitive is pressed on an image-receiving material to transfer the unpolymerized polymerizable compound to the image-receiving material, whereby a polymer image can be formed on the image-receiving material. For applying a pressure on the light-sensitive material, various known methods can be employed.

In the case that the light-sensitive layer contains a color image forming substance, the light-sensitive material is subjected to the heat development process to cure the polymerizable compound, and thereby the color image forming substance in the cured portion is fixed. Then, the light-sensitive material is pressed on an image-receiving material to transfer the color image forming substance in the uncured portion to the image-receiving material. Thus, a color image can be formed on the image-receiving material.

After the image is formed on the image-receiving material, the image-receiving material can be heated to polymerize the transferred unpolymerized polymerizable compound as described in Japanese Patent Provisional Publication No. 62(1987)-210459. Through the above-mentioned process, the obtained image can be improved in the preservability.

Various image recording apparatus can be used for the image-forming method. An example of the apparatus comprises an exposure device for imagewise exposing the light-sensitive material to form a latent image, a heat development device for fixing the area corresponding to the latent image, a transfer device for pressing the developed light sensitive material on the image-receiving material. Another example of the apparatus comprises an fixing apparatus for irradiating with light, pressing or heating the image-receiving material on which an image has been transferred in addition to the above-mentioned devices.

The image-receiving material employable in the above-mentioned image-forming method is described below.

As the support of the image-receiving material, there can be employed a baryta paper in addition to various mate rials employable as the support of the light-sensitive material. In the case that a porous material such as paper is employed as the support of the image-receiving material, the porous support preferably has a certain smoothness as described in Japanese Patent Provisional Publication No. 62(1987)-209530. An image-receiving material employing a transparent support is described in Japanese Patent Publication No. 62(1987)-209531.

The image-receiving material is usually prepared by providing an image-receiving layer on the support. The image-receiving layer can be constructed using a variety of compounds according to the color formation system. In the cases that polymer image is formed on the image-receiving material and that a dye or pigment is employed as the color image forming substance, the image-receiving material can be composed of the support only.

For example, when a color formation system using a color former and a developer is employed, the developer can be contained in the image-receiving layer. Otherwise, the image-receiving layer can be composed of at least one layer containing a mordant. The mordant can be selected from various compounds which are known in the art of the conventional photography in consideration of nature of the color image forming substance. If desired, the image-receiving layer can be composed of two or more layers containing a plurality of mordants different from each other in the mordanting power.

The image-receiving layer preferably contains a polymer as a binder. The binder which is employable for the aforementioned light-sensitive layer can be also employed for the image-receiving layer. Further, a polymer having a lower transmission coefficient of oxygen can be used as the binder, as described in Japanese Patent Provisional Publication No. 62(1987)-209454.

The image-receiving layer can contain a thermoplastic compound. In the case that the thermoplastic compound is contained in the image-receiving layer, the image-receiving layer itself is preferably composed of an agglomerate of fine particles of the thermoplastic compound (i.e., granulated thermoplastic compound). The image-receiving layer having the above constitute has such advantages that the formation of a transferred image can be readily done and a glossy image can be obtained under heating after the image formation.

The image-receiving material having an image-receiving layer containing the granulated thermoplastic compound is described in Japanese Patent Provisional Publication Nos. 62(1987)-280071 and 62(1987)-280739.

A photopolymerization initiator or a thermal polymerization initiator may be contained in the image-receiving layer. In the image-formation process using an image-receiving material, a color image forming substance is transferred together with the unpolymerized polymerizable compound as described hereinafter, so that the photopolymerization initiator or thermal polymerization initiator can be contained in the image-receiving layer to smoothly perform the curing procedure (fixing procedure) of the unpolymerized polymerizable compound. The image-receiving material having the image-receiving layer containing a photopolymerization initiator is described in Japanese Patent Provisional Publication No. 62(1987) 161149. The image-receiving layer containing a thermal polymerization initiator is described in Japanese Patent Provisional Publication No. 62(1987)-210444.

A dye or pigment can be contained in the image-receiving layer for the purpose of entering letters, symbols, frames, etc. in the image-receiving layer, or of giving a certain color to the background for the image. Further, the dye or pigment can be also employed for the purpose of making it easy to distinguish the sides of the image-receiving material. As the dye of pigment, there can be employed a variety of known dyes or pigments employable for the image formation. However, in the case that the dye or pigment may disturb the image formed on the image receiving layer, it is preferred to make the density of the dye or pigment low (e.g., reflection density of not higher than 1), or to employ a dye or pigment having a property of being discolored when it is heated or irradiated with light. The image-receiving material comprising the image-receiving layer which contains a dye or pigment having a property of being discolored when it is heated or irradiated with light is disclosed in Japanese Patent Provisional Publication No. 62(1987)-251741.

Further, when a white pigment such as titanium dioxide and barium sulfate is contained in the image-receiving layer, the image-receiving layer can function as a white reflection layer. In this case, the white pigment is used in an amount of 10 to 100 g based on 1 g of the thermoplastic compound.

The above-mentioned dye and pigment can be either uniformly or partially contained in the image-receiving layer. For example, when the support is composed of transparent material, the white pigment can be partially contained in the image-receiving layer to make a part of a reflection image transparent. Thus, information of the image which is unnecessary in the transparent image can be entered in the part of the image-receiving layer containing the white pigment as a reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer composed of an agglomerate of granulated thermoplastic compound can be also provided on the surface of the image-receiving layer as described in Japanese Patent Provisional Publication No. 62(1987)-210460.

Further, other various layers such as a layer containing a self-adhesive or adhesive and a release paper can be laminated on the surface of the support not facing the image-receiving layer. A sticker type image-receiving material having the above structure is described in Japanese Patent Provisional Publication No. 63(1988)-24647.

The light-sensitive material of the invention can be used for monochromatic or color photography, printing, radiography, medical diagnosis (e.g., CRT photography of diagnostic device using ultrasonic wave), copy (e.g., computer-graphic hard copy), etc.

The present invention is further described by the following examples without limiting the invention.

EXAMPLE 1

Preparation of silver halide emulsion

In 1,200 ml of water were dissolved 25 g of gelatin and 3 g of potassium bromide, and the resulting gelatin solution was kept at 70 ° C. To the gelatin solution, 600 ml of aqueous solution containing 117 g of potassium bromide and 600 ml of aqueous solution containing 0.74 mole of silver nitrate were added simultaneously at the same feed rate over 45 minutes. After 5 minute, to the resulting mixture was added 200 ml of aqueous solution containing 4.3 g of potassium iodide over 5 minutes. The emulsion was washed with water for desalting. Then, 24 g of gelatin was dissolved in the emulsion. The emulsion was stirred at 50° C. for 15 minutes. The yield of the emulsion was 1,000 g.

Preparation of light-sensitive composition

In 100 g of trimethylolpropane triacrylate were dissolved 0.4 g of the following copolymer and 10 g of Pargascript Red I-6-B (tradename of Ciba Geigy).

(Copolymer)

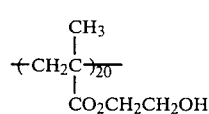

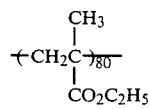

In 18 g of the resulting solution was dissolved 0.36 g of a surface active agent (Nissan Nonion NS 208.5, produced by of Nippon Oils And Fats Co., Ltd.). To the solution was further added a solution obtained by dissolving 1.29 g of the following hydrazine derivative ((a), reducing agent), 1.22 g of the following developing agent (reducing agent), 0.003 g of the following thiol derivative and 0.018go of the following development inhibitor-releasing precursor in 4 g of methylene chloride, to prepare an oily liquid.

(Hydrazine derivative (a))

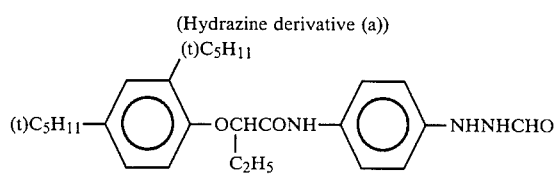

(Developing agent)

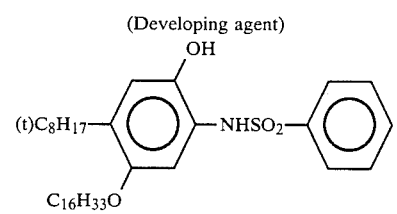

(Thiol Derivative)

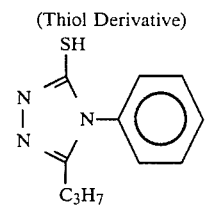

(Development inhibitor-releasing precursor)

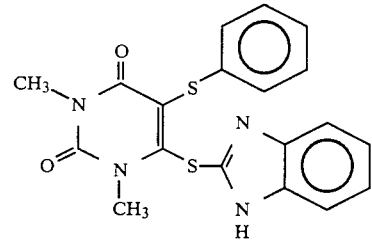

To 2.0 g of the above-obtained silver halide emulsion were added 0.45 g of 10% aqueous solution of potassium bromide and $10^{-4}$ mole (based on 1 mole of the silver halide grains) of the following hydrazine derivative (8) to prepare an aqueous liquid.

(Hydrazine derivative (8))

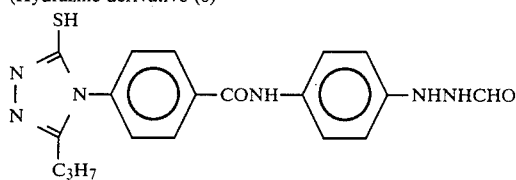

The aqueous liquid was added to the above-prepared oily liquid, and the mixture was stirred at 1,5000 r.p.m. for 5 minutes using a homogenizer to obtain a light-sensitive composition (A) in the form of a W/O emulsion.

Preparation of licht.sensitive microcapsule dispersion

To the light-sensitive composition (A) was added 0.9 g of a polyisocyanate compound (Takenate D110N of Takeda Chemical Industries, Ltd.). The resulting mixture was added to 40 g of a 10 % aqueous solution of partial sodium salt of polyvinyl.benzene sulfonic acid (trade name: VERSA TL-502, available from National Starch, Co.) having been adjusted to pH 3.5 using 20 % solution of phosphoric acid. The resulting mixture was heated to 40° C. and stirred at 7,000 r.p.m. for 30 minutes using a homogenizer to obtain a W/O/W emulsion in which the oily droplets has a thin polyurea resin shell.

Independently, to 13.2 g of melamine were added 21.6 g of 37 % aqueous solution of formaldehyde and 70.8 g of water, and the resulting mixture was stirred at 60° C for 30 minutes to obtain a transparent melamine-formaldehyde precondensate.

To the above.prepared W/O/W emulsion was added 10 g of the precondensate, and the resulting mixture was adjusted to pH 6.0 using a 20% aqueous solution of phosphoric acid under stirring. The mixture was then heated to 65° C and stirred for 90 minutes, to obtain a light-sensitive microcapsule dispersion containing microcapsules having polyurea resin inner shell and melamine formaldehyde resin outer shell.

Further, for removing the remaining formaldehyde in the microcapsule dispersion, to the dispersion was added 5.4 g of 40 % aqueous solution of urea. The resulting mixture was then adjusted to pH 3.5 using 20 % aqueous solution of phosphoric acid, and the mixture was stirred for 40 minutes. The mixture was further adjusted to pH 7.0 using 10% aqueous solution of sodium hydroxide, and the cooled.

Preparation of light-sensitive material

To 30 g of the above-prepared microcapsule dispersions were added 4 ml of 5% aqueous solution of the following nonion-surface active agent, 9 ml of 2% aqueous solution of sorbitol, 10 ml of 20% aqueous fine dispersion of starch and 7 ml of 20% aqueous fine dispersion of the following base precursor to prepare a coating solution for a light-sensitive layer.

(Nonion surface active agent)

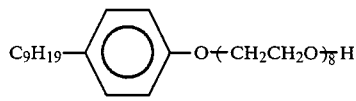

(Base precursor)

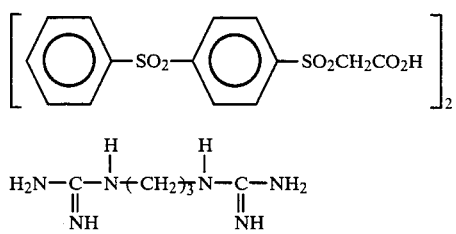

The coating solution was coated over a coated paper having basis weight of 65 g/m² to give a light-sensitive layer having wet thickness of 45 μm. The coated layer was dried to prepare light-sensitive materials (A).

EXAMPLE 2

Preparation of light-sensitive composition

Light-sensitive compositions (B) to (N) were prepared in the same manner as in the preparation of the light-sensitive composition (A) except that the following hydrazine derivatives (9), (21), (22), (30), (32), (38), (39), (40), (41), (42), (43), (44) and (45) were respectively used in place of the hydrazine derivative (8).

(Hydrazine derivative (9))

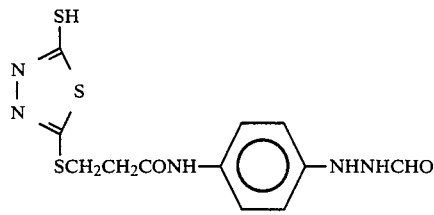

(Hydrazine derivative (21))

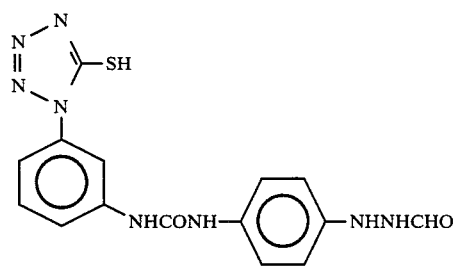

(Hydrazine derivative (22))

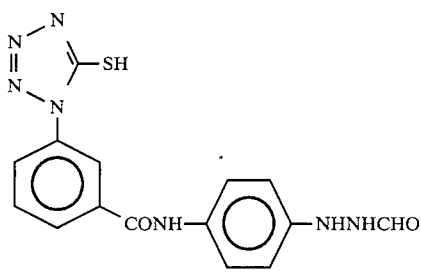
(Hydrazine derivative (30))
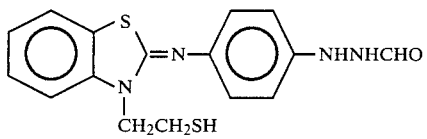
(Hydrazine derivative (32))
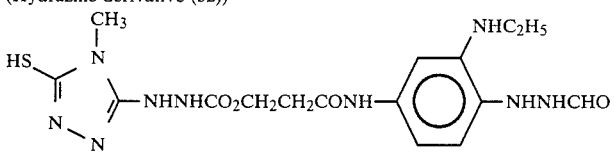
(Hydrazine derivative (38))
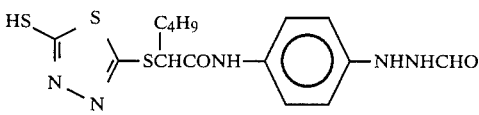
(Hydrazine derivative (39))
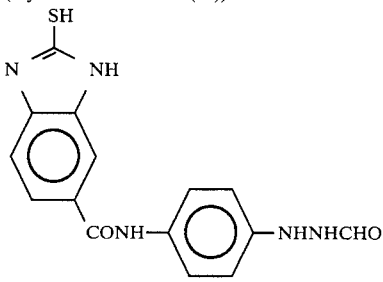
(Hydrazine derivative (40))
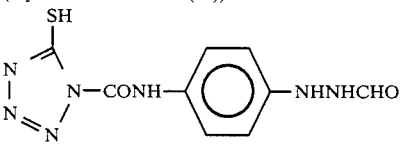
(Hydrazine derivative (41))
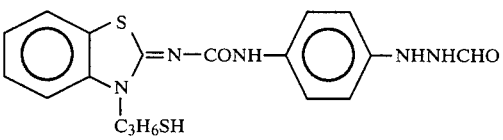
(Hydrazine derivative (42))
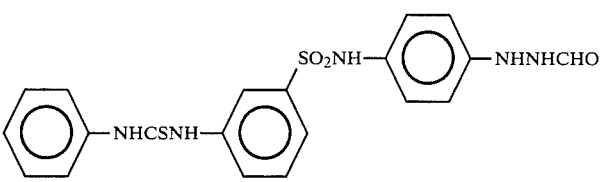
(Hydrazine derivative (43))

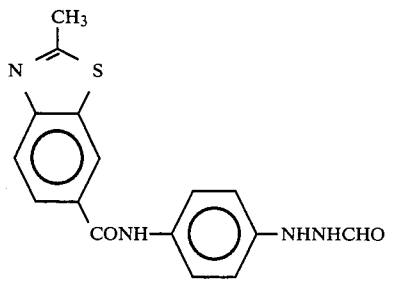

(Hydrazine derivative (44))

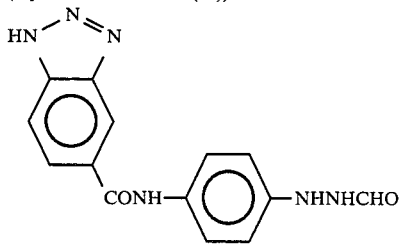

(Hydrazine derivative (45))

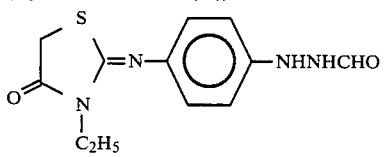

Preparation of light-sensitive material

Light-sensitive materials (B) to (N) were prepared in the same manner as in the Example 1 except that the above. prepared light-sensitive compositions (B) to (N) were respectively used in place of the light-sensitive composition (A).

COMPARISON EXAMPLE 1

Preparation of licht-sensitive composition

A Light-sensitive composition (X) was prepared in the same manner as in the preparation of the light-sensitive composition (A) except that the hydrazine derivative (8) was not used.

Preparation of light-sensitive material

A light-sensitive material (X) was prepared in the same manner as in the Example 1 except that the above-prepared light-sensitive composition (X) was used in place of the light-sensitive composition (A).

Preparation of image-receiving material

To 125 g of water was added 11 g of 40 % aqueous solution of sodium hexametaphosphate, and to the mixture were further added 34 g of zinc 3,5-di-α-methylvenzylsalicylate and 82 g of 55 % slurry of calcium carbonate, followed by coarsely dispersing in a mixer. The resulting coarse dispersion was then finely dispersed in Dynomill dispersing device. To 200 g of the resulting dispersion were added 6 g of 50% latex of SBR and 55 g of 8% aqueous solution of polyvinyl alcohol, and the resulting mixture was made uniform to give a coating solution for an image-receiving layer. The coating solution was uniformly coated on a paper support having basis weight of 80 g/m² to give a coating layer having wet thickness of 90 μm. The coated layer was dried to prepare an image-receiving material.

Evaluation of the light-sensitive material

Each of the light-sensitive materials prepared in Examples 1 & 2 and Comparison Example 1 was exposed to light using a tungsten lamp at 2,000 lux for 1 second through a continuous filter having a transmission density of 0.1 to 4.0. Each of the light-sensitive material was heated at 150° C for 10 seconds in a heating device having a belt conveyor and heating rolls. Each of the light-sensitive materials was then combined with the image-receiving material and they were pressed through a press roller at pressure of 500 kg/cm². The image obtained on the image receiving material was evaluated using a reflection densitometer.

The results are set forth in Table 1. In Table 1, "Relative Sensitivity" means a relative sensitivity when the sensitivity (the exposure required to obtain the density of 0.5 in the image) of the light-sensitive material (X) is 100.

TABLE 1

| Light-sensitive Material | Hydrazine Derivative | Maximum Density | Minimum Density | Relative Sensitivity |
|---|---|---|---|---|
| (A) | (8) | 1.09 | 0.07 | 209 |
| (B) | (9) | 1.12 | 0.08 | 166 |
| (C) | (21) | 1.12 | 0.13 | 130 |
| (D) | (22) | 1.10 | 0.10 | 158 |
| (E) | (30) | 1.10 | 0.07 | 204 |
| (F) | (32) | 1.10 | 0.13 | 141 |
| (G) | (38) | 1.10 | 0.13 | 138 |
| (H) | (39) | 1.10 | 0.10 | 155 |
| (I) | (40) | 1.10 | 0.12 | 138 |
| (J) | (41) | 1.11 | 0.08 | 170 |
| (K) | (42) | 1.14 | 0.13 | 115 |
| (L) | (43) | 1.14 | 0.13 | 115 |
| (M) | (44) | 1.14 | 0.07 | 110 |
| (N) | (45) | 1.13 | 0.13 | 115 |
| (X) | — | 1.10 | 0.16 | 100 |

EXAMPLE 3

Preparation of light-sensitive composition

Light-sensitive compositions (B-1) to (B-5) were prepared in the same manner as in the preparation of the light-sensitive composition (B) except that the amount of the hydrazine derivative (9) was changed in accordance with Table 2.

Preparation of light-sensitive material

Light-sensitive materials (B-1) to (B-5) were prepared in the same manner as in the preparation of the light-sensitive material (B) except that the above.prepared light-sensitive compositions (B-1) to (B-5) were respectively used in place of the light-sensitive composition (B).

COMPARISON EXAMPLE 2

A light-sensitive composition (B-Y) was prepared in same manner as in the preparation of the light-sensitive composition (B) except that $1 \times 10^{-6}$ mole (based on 1 mole of the silver halide grains) of the hydrazine derivative (9) was used.

Preparation of light-sensitive material

A light-sensitive material (B-Y) was prepared in the same manner as in the preparation of the light-sensitive material (B) except that the above-prepared light-sensitive compositions (B-Y) was used in place of the light-sensitive composition (B).

COMPARISON EXAMPLE 3

Preparation of light-sensitive composition

A light-sensitive composition (B-Z) was prepared in the same manner as in the preparation of the light-sensitive mole of the silver halide grains) of the hydrazine derivative (9) was added to the polymerizable compound (oily liquid).

Preparation of light-sensitive material

A light-sensitive material (B-Z) was prepared in the same manner as in the preparation of the light-sensitive material (B) except that the above-prepared light-sensitive compositions (B-Z) was used in place of the light-sensitive composition (B).

Evaluation of the light-sensitive material

Each of the light-sensitive mateials prepared in Example 3 and Comparison Examples 2 & 3 was evaluated in the same manner as in Example 1.

The results are set forth in Table 2. For reference, the results of the light-sensitive materials (B) and (X) are set forth again in Table 2.

TABLE 2

| Light-sensitive Material | Amount of Hydrazine | Maximum Density | Minimum Density | Relative Sensitivity |
|---|---|---|---|---|
| (B-1) | $5 \times 10^{-1}$ mole | 1.11 | 0.14 | 115 |
| (B-2) | $10^{-5}$ mole | 1.11 | 0.11 | 135 |
| (B) | $10^{-4}$ mole | 1.12 | 0.08 | 166 |
| (B-3) | $10^{-3}$ mole | 1.10 | 0.08 | 165 |
| (B-4) | $10^{-2}$ mole | 1.12 | 0.11 | 130 |
| (B-5) | $5 \times 10^{-2}$ mole | 1.13 | 0.14 | 120 |
| (X) | — | 1.10 | 0.16 | 100 |
| (B-Y) | $10^{-6}$ mole | 1.10 | 0.15 | 100 |
| (B-Z) | $10^{-1}$ mole | 1.15 | 1.00 | — |

It is apparent from the results shown in Table 2 that the light-sensitive material of the present invention (in which the hydrazine derivative is adsorbed on the silver halide grains in an amount of $5 \times 10^{-6}$ to $5 \times 10^{-2}$ mole based on 1 mole of the silver halide grains) has a high sensitivity and gives a clear image having a high contrast.

EXAMPLE 4

Preparation of light-sensitive composition

Light-sensitive compositions (E-1) to (E-5) were prepared in the same manner as in the preparation of the light-sensitive composition (E) except that the amount of the hydrazine derivative (a) and the amount of the hydrazine derivative (30) were changed in accordance with Table 3.

Preparation of light-sensitive material

Light-sensitive materials (E-1) to (E-5) were prepared in the same manner as in the preparation of the light-sensitive material (E) except that the above.prepared light-sensitive compositions (E-1) to (E-5) were respectively used in place of the light-sensitive composition (E).

EXAMPLE 5

Preparation of light-sensitive composition

A light-sensitive composition (E-6) was prepared in the same manner as in the preparation of the light-sensitive composition (E) except that 0.098 g ($1 \times 10^{-1}$ mole based on 1 mole of the hydrazine derivative (a)) of the hydrazine derivative (30) was added to the polymerizable compound (oily liquid).

Preparation of light-sensitive material

A light-sensitive material (E-6) was prepared in the same manner as in the preparation of the light-sensitive material (E) except that the above.prepared light-sensitive compositions (E-6) was used in place of the light-sensitive composition (E).

COMPARISON EXAMPLE 4

Preparation of light-sensitive composition

A light-sensitive composition (E-Y) was prepared in the same manner as in the preparation of the light-sensitive composition (E) except that $1 \times 10^{-6}$ g ($1 \times 10^{-6}$ mole based on 1 mole of the hydrazine derivative (a)) of the hydrazine derivative (30) was used.

Preparation of light-sensitive material

A light-sensitive material (E-Y) was prepared in the same manner as in the preparation of the light-sensitive material (E) except that the above-prepared light-sensitive compositions (E-Y) was used in place of the light-sensitive composition (E).

COMPARISON EXAMPLE 5

Preparation of light-sensitive composition

A light-sensitive composition (E-Z) was prepared in the same manner as in the preparation of the light-sensitive composition (E) except that 0.98 g (1 mole based on 1 mole of the hydrazine derivative (a)) of the hydrazine derivative (30) was used.

Preparation of light-sensitive material

A light-sensitive material (E-Z) was prepared in the same manner as in the preparation of the light-sensitive material (E) except that the above-prepared light-sensitive compositions (E-Z) was used in place of the light-sensitive composition (E).

Evaluation of the light-sensitive material

Each of the light-sensitive mateirals prepared in Examples 4 & 5 and Comparison Examples 4 & 5 was evaluated in the same manner as in Example 1.

The results re set forth in Table 3.

TABLE 3

| Light-sensitive Material | Amount of Hydrazine | | Maximum Density | Minimum Density | Relative Sensitivity |
|---|---|---|---|---|---|
| | (a) g (mole) | (30) g (mole) | | | |
| (E-1) | 1.29 (1) | $10^{-5}$ ($10^{-5}$) | 1.10 | 0.10 | 150 |
| (E-2) | 1.29 (1) | $10^{-4}$ ($10^{-4}$) | 1.11 | 0.07 | 204 |
| (E-3) | 0.64 (½) | $10^{-3}$ ($10^{-3}$) | 1.10 | 0.09 | 200 |
| (E-4) | 0.32 (¼) | $10^{-3}$ ($10^{-3}$) | 1.11 | 0.11 | 200 |
| (E-5) | 1.29 (1) | $10^{-2}$ ($10^{-2}$) | 1.12 | 0.09 | 150 |
| (E-6) | 1.29 (1) | 0.098 ($10^{-1}$) | 1.12 | 0.10 | 130 |
| (X) | 1.29 (1) | — | 1.10 | 0.16 | 100 |
| (E-Y) | 1.29 (1) | $10^{-6}$ ($10^{-6}$) | 1.10 | 0.09 | 100 |
| (E-Z) | 1.29 (1) | 0.98 (1) | 1.15 | 1.15 | — |

It is apparent from the results shown in Table 3 that the light-sensitive material in which the hydrazine derivative is adsorbed onteh silver halide grains in an amount of $1 \times 10^{-5}$ to $1 \times 10^{-1}$ mole based on 1 mole of the hydrazine derivative having a function of the reducing agent has a high sensitivity and gives a clear image having a high contrast.

What is claimed is:

1. A light-sensitive material comprising a support and a light-sensitive layer provided thereon which contains silver halide grains, a reducing agent and na ethylenically unsaturated polymerizable compound, wherein the light-sensitive layer further contains at least two hydrazine derivaties, one of the hydrazine derivatives being adsorbed on the silver halide grains in an amount of $5 \times 10^{-6}$ to $5 \times 10^{-2}$ mole based on 1 mole of the silver halide grains,and having the following formula [I]:

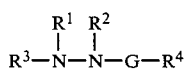
[I]

in which one of he $R^1$ and $R^2$ is hydrogen, and the other is a monovalent group selected from the group consisting of hydragen, an alkysulfonyl group, an arylsulfonyl group andan acyl group; $R^3$ is a monovalent group selected from the group consiting of an aliphatic group and a heeterocyclic group; $R^4$ is a monovalent group selected from the group consisting of an alkyl group, an aralkyl group, an aryl group, an alkoxy group, an aryloxy group, amino and carbamoyl; at least one hydrogen atom contained in $R^3$ and $R^4$ is replaced with a group capable of being adsorbed on silver halide grains; G is a divalent group selected from the group consisting of carbonyl, sulfonyl, sulfinyl,

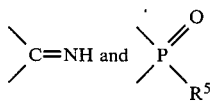

wherein $R^5$ is a monovalent groupselected from the group consisting of hydrogen, an alkyl group, an aralkyl group, an aryl group, as alkoxy group, an aryloxy group, amino and carbamoyl; and each of $R^1$, $R^2$, $R^3$, Rhu 4, $R^5$ and G may have one or more substituent groups, and the other hydrazine derivative having a functino of a reducing agent, and wherein said hydrazine having the formula [I] and being contained in teh light-sensitive layer is present in an amount of $1 \times 10^{-5}$ to $1 \times 10^{-1}$ mole based on one mole of thehydrazine derivative having a function of a reducing agent.

2. The light-sensitive material as claimed in claim 1, wherein the hydrazine derivative having the formula [I] is adsorbed on the silver halide grains in an amount of $1 \times 10^{-5}$ to $1 \times 10^{-2}$ mole based on 1 mole of the silver halide grains.

3. The light-sensitive material as claimed in claim 1, wherein the a group capable of being adsorbed on silver halide grains in the formula [I] has a nitrogen containing heterocyclic ring.

4. The light-sensitive material as claimed in claim 1, wherein each of $R^1$ and $R^2$ in the formula [I] is hydrogen.

5. The light-sensitive material as claimed in claim 1, wherein $R^3$ in the formula [I] is phenyl.

6. The light-sensitive material as claimed in claim 1, wherein $R^4$ in the formula [I] is hydrogen.

7. The light-sensitive material as claimed in claim 1, wherein G in the formula [I] is carbonyl.

8. The light-sensitive material as claimed in claim 1, wherein the light-sensitive layer contains a developing agent having a function of the reducing agent.

9. The light-sensitive material as claimed in claim 1, wherein the silver halide grains, the two hydrazine derivatives and the polymerizable compound are contained in microcapsules which are dispersed in the light-sensitive layer.

10. The light-sensitive material as claimed in claim 1, wherein the hydrazine derivative having a function of the reducing agent has the following formula [VIII]:

$$R^{81}-NH-NH-Y-R^{82} \qquad [VIII]$$

in which $R^{81}$ is a monovalent group selected from the group consisting of an alkyl group, an aralkyl group, an aryl group, an alkenyl group, an alkynyl group, and a hetero. cyclic group, each of which may have one or more substituent groups; Y is $>C=O$ or $-SO_2-$; and $R^{82}$ is a monovalent group selected from the group consisting of hydrogen, an alkyl group, a cycloalkyl group, an aralkyl group, an aryl group, an alkenyl group, an alkynyl group, a heterocyclic group, an alkoxy group, an aryloxy group, an alkylthio group, an arylthio group and amino, each of which may have one or more substituent groups.

11. The light-sensitive material as claimed in claim 1, wherein the hydrazine derivative having a function of the reducing agent has the following formula [IV]:

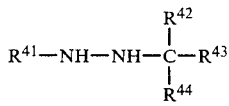  [IV]

in which $R^{41}$ is an aryl group or an aromatic heterocyclic group, each of which may have one or more substituent groups; each of $R^{42}$ and $R^{43}$ is an aryl group which may have one or more substituent groups; and $R^{44}$ is a monovalent group selected from the group consisting of hydrogen, an alkyl group, an aryl group, an alkoxycarbonyl group and carbamoyl, each of which may have one or more substituent groups.

12. The light-sensitive material as claimed in claim 1, wherein the hydrazine derivative having a function of the reducing agent has the following formula [V]:

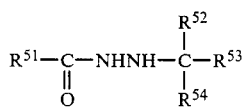  [V]

in which $R^{51}$ is a monovalent group selected from the group consisting of hydrogen, an alkyl group, a cycloalkyl group, an alkenyl group, an aryl group, an aralkyl group, an alkynyl group and a heterocyclic group, each of which may have one or more substituent groups; each of $R^{52}$ and $R^{53}$ independently is an aryl group which may have one or more substituent group, or $R^{52}$ and $R^{53}$ form, together with the neighboring carbon, a condensed aromatic ring; $R^{54}$ is a monovalent group selected from the group consisting of an aryl group, a heterocyclic group, hydrogen, an alkyl group, an alkoxycarbonyl group and carbamoyl, each of which may have one or more substituent groups.

13. The light-sensitive material as claimed in claim 1, wherein the hydrazine derivative having a function of the reducing agent has the following formula [VI] or [VII]:

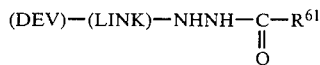  [VI]

-continued

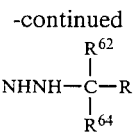  [VII]

in which $R^{61}$ is a monovalent group selected from the group consisting of hydrogen, an alkyl group, a cycloalkyl group, an alkenyl group, an alkynyl group, an aralkyl group, an aryl group and a heterocyclic group, each of which may have one or more substituent groups; each of $R^{62}$ and $R^{63}$ independently is an aryl group which may have one or more substituent groups, or $R^{62}$ or $R^{63}$ form, together with the neighboring carbon, a condensed aromatic ring; $R^{64}$ is a monovalent group selected from the group consisting of an alkyl group, an aryl group, an alkoxycarbonyl group and carbamoyl, each of which may have one or more substituent groups; (DEV) is a monovalent group having a function of reducing silver halide; and (LINK) is a divalent linkage group.

14. The light-sensitive material as claimed in claim 1, wherein the hydrazine derivative having a function of the reducing agent is dissolved or dispersed in the polymerizable compound, and is out of contact with the silver halide grains.

15. The light-sensitive material as claimed in claim 1, wherein the silver halide grains, the two hydrazine derivatives and the polymerizable compound are contained in microcapsules which are dispersed in the light-sensitive layer, the shell of the microcapsules containing the silver halide grains and the hydrazine derivative having the formula [I], and the core of the microcapsules containing the polymerizable compound and the hydrazine derivative having a function of the reducing agent.

16. The light-sensitive material as claimed in claim 1, wherein the silver halide grains, the two hydrazine derivatives and the polymerizable compound are contained in microcapsules which are dispersed in the light-sensitive layer, at least 30 weight % of the hydrazine derivative having the formula [I] being arranged in the shell of the microcapsules, and at least 90 weight % of the hydrazine derivative having a function of the reducing agent being arranged in the core of the microcapsules.

* * * * *

UNITED STATES PATENT AND TRADEMARK OFFICE
CERTIFICATE OF CORRECTION

PATENT NO. : 5,030,542

DATED : July 9, 1991

INVENTOR(S) : Nakamura et al

It is certified that error appears in the above-identified patent and that said Letters Patent is hereby corrected as shown below:

On the title page, below item [56]:

The name of Assistant Examiner: "Tanis L. Dote" to "Janis L. Dote";

Column 53, line 41: "na ethyleni-" to "an ethyleni-";
Column 53, line 44: "derivaties" to "derivatives",
Column 53, line 47: "grains,and" to "grains, and";
Column 53, line 55: "he $R^1$" to "the $R^1$";
Column 53, line 57: "hydragen" to "hydrogen";
Column 53, line 57: "alkysulfonyl" to "alkylsulfonyl";
Column 53, line 58: "andan" to "and an";
Column 53, line 60: "consiting" to "consisting";
Column 53, line 60: "heeterocyclic" to "heterocyclic";
Column 54, line 8: "groupselected" to "group selected";
Column 54, line 10: "as alkoxy" to "an alkoxy";
Column 54, line 12: "Rhu 4" to "$R^4$";
Column 54, line 14: "functino" to "function";
Column 54, line 16: "teh" to "the"; and
Column 54, line 18: "thehydrazine" to "the hydrazine".

Signed and Sealed this

Third Day of November, 1992

*Attest:*

DOUGLAS B. COMER

*Attesting Officer*      *Acting Commissioner of Patents and Trademarks*